United States Patent
Furukawa et al.

(10) Patent No.: US 9,316,360 B2
(45) Date of Patent: Apr. 19, 2016

(54) LIGHT SOURCE UNIT, LIGHT SOURCE DEVICE, AND DISPLAY APPARATUS

(75) Inventors: Norimasa Furukawa, Tokyo (JP);
Hiroshi Murayama, Kanagawa (JP);
Ichiro Murakami, Tokyo (JP)

(73) Assignee: Sony Corporation, Tokyo (JP)

( * ) Notice: Subject to any disclaimer, the term of this patent is extended or adjusted under 35 U.S.C. 154(b) by 672 days.

(21) Appl. No.: 12/390,721

(22) Filed: Feb. 23, 2009

(65) Prior Publication Data
US 2009/0213573 A1    Aug. 27, 2009

(30) Foreign Application Priority Data
Feb. 25, 2008  (JP) ................ P2008-043369

(51) Int. Cl.
| | | |
|---|---|---|
| F21V 19/00 | (2006.01) | |
| F21K 99/00 | (2010.01) | |
| G02F 1/1335 | (2006.01) | |
| F21Y 103/00 | (2006.01) | |
| F21Y 101/02 | (2006.01) | |

(52) U.S. Cl.
CPC ... *F21K 9/00* (2013.01); *F21K 9/30* (2013.01); *F21V 19/0045* (2013.01); *F21V 19/0025* (2013.01); *F21Y 2101/02* (2013.01); *F21Y 2103/003* (2013.01); *G02F 1/133603* (2013.01)

(58) Field of Classification Search
CPC ......... F21K 9/00; F21K 9/30; F21V 19/0025; F21V 19/0045; G02F 1/133603; F21Y 2103/003; F21Y 2101/02
USPC ............ 362/222, 612, 613, 614, 555
See application file for complete search history.

(56) References Cited

U.S. PATENT DOCUMENTS

| | | | | |
|---|---|---|---|---|
| 3,371,148 A | * | 2/1968 | Roques et al. | 174/553 |
| 3,525,864 A | * | 8/1970 | Leach | 250/461.1 |
| 3,609,235 A | * | 9/1971 | Sawyer | 348/835 |
| 4,600,974 A | * | 7/1986 | Lew et al. | 362/102 |
| 6,057,561 A | * | 5/2000 | Kawasaki et al. | 257/94 |
| 6,612,717 B2 | * | 9/2003 | Yen | 362/245 |
| 6,619,831 B2 | * | 9/2003 | Kanesaka | 362/555 |
| 6,682,205 B2 | * | 1/2004 | Lin | 362/555 |
| 7,125,137 B2 | * | 10/2006 | Kitajima et al. | 362/153 |
| 7,285,802 B2 | * | 10/2007 | Ouderkirk et al. | 257/98 |
| 7,503,673 B2 | * | 3/2009 | Chou | 362/240 |
| 7,837,348 B2 | * | 11/2010 | Narendran et al. | 362/231 |
| 2008/0080175 A1 | * | 4/2008 | Lee et al. | 362/223 |

FOREIGN PATENT DOCUMENTS

| | | | | |
|---|---|---|---|---|
| JP | 1 276505 | 11/1989 | | |
| JP | 05333317 A | * 12/1993 | ............ | G02F 1/133 |
| JP | 2002 163907 | 6/2002 | | |
| JP | 2004 30929 | 1/2004 | | |
| JP | 2006 12860 | 1/2006 | | |
| JP | 2007 225741 | 9/2007 | | |

* cited by examiner

*Primary Examiner* — Sharon Payne
(74) *Attorney, Agent, or Firm* — Wolf, Greenfield & Sacks, P.C.

(57) ABSTRACT

A light source unit is used in a multiply combined manner, and includes a light source element having a substrate and one or more light emitting elements disposed on the substrate. The light source unit is configured such that when a plurality of the light source units are arranged in cascade, the light source element in the light source unit comes to in electric connection with another light source element in an adjacent light source unit. Thereby, the plurality of light source units may emit light at the same time. Thus, the structure similar to rod-shaped light source such as CCFL is achieved.

22 Claims, 23 Drawing Sheets

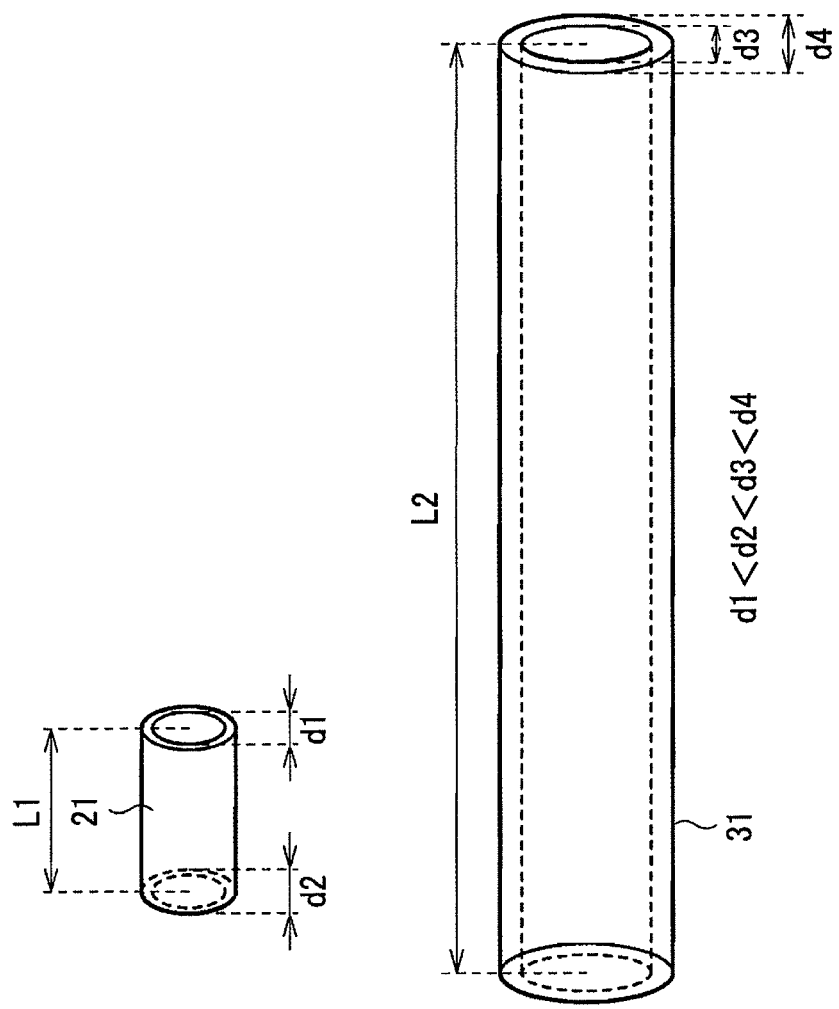

LIGHT SOURCE UNIT, LIGHT SOURCE DEVICE, AND DISPLAY APPARATUS

CROSS REFERENCE TO RELATED APPLICATIONS

The present invention contains subject matter related to Japanese Patent Application JP 2008-043369 filed in the Japanese Patent Office on Feb. 25, 2008, the entire contents of which being incorporated herein by reference.

BACKGROUND OF THE INVENTION

1. Field of the Invention

The present invention relates to a light source unit using, for example, LED (Light Emitting Diode) as a light emitting element, to a light source device including a plurality of the light source units being combined to one another, and to a display apparatus using the light source device as a backlight.

2. Background Art

A light source using a bar-like fluorescent tube or a rod-like fluorescent tube such as CCFL (Cold Cathode Fluorescent Lamp) has been known as a light source of a backlight of a liquid crystal display apparatus and the like. Moreover, a backlight has been proposed, such as in Japanese Unexamined Patent Application Publication No. 2001-266605, in which a rod-like ultraviolet lamp is used as a light source, and in which ultraviolet rays are converted into visible light for illumination light.

SUMMARY OF THE INVENTION

Furthermore, recently, a light source using LED (Light Emitting Diode) has appeared as a light source of a backlight. Light sources for the backlight include a light source using respective color LED of R (red), G (green) and B (blue) being combined into color mixture, and a light source using a single LED chip for white light emission. Particularly, since it is considered that the light source using a single LED chip for white light emission may not require a servo system for color matching, and may provide a relatively wide color display range, the light source has been considered to be promising, and now practically used as a white backlight. In this case, a configuration of the backlight typically includes a light guide type where light from a light source, being disposed in a side face direction with respect to an illumination object, is guided to an illumination object side via a light guide plate, and a direct type where a light source is disposed directly below an illumination object. A diffuser plate is disposed at a light emission side of the backlight for uniforming illumination light.

In the case of the light guide type, the backlight is practically used for a mobile phone or the like through reduction of thickness of the diffuser plate and the like. In the light guide type, design of the diffuser plate is devised, thereby the backlight becomes advantageous for reduction in thickness. However, the light guide type has a difficulty in a way which allows light in the light guide to exit from the light guide. Generally, since operation that light entering the inside of a diffuser plate through total reflection is emitted to the outside of the plate is contrary to operation that the light is contained within the plate, contradiction exists in that point, leading to a disadvantage of low light-use efficiency. Moreover, since the light guide type has relatively heavy weight, the light guide type is not frequently used for a large device. On the other hand, the direct type has high light-use efficiency, but has a disadvantage that thickness reduction is difficult.

In this way, the light guide type and the direct type have both advantages and disadvantages respectively. In particular, the direct type, being used for a large liquid crystal TV or the like, is now necessary to be reduced in thickness, to be increased in luminance, and to be decreased in unevenness of chromaticity.

The Japanese Unexamined Patent Application Publication No. 2001-266605 describes an invention where a reflective plate is disposed outside an ultraviolet lamp, and a fluorescent light emission plate is disposed on a surface of the reflective plate and excited by ultraviolet light from the ultraviolet lamp, thereby fluorescent light emission with high light-use efficiency is made. In the structure described in Japanese Unexamined Patent Application Publication No. 2001-266605, ultraviolet rays are used for excitation light, which are invisible. Moreover, since mercury-discharge UV fluorescent-light-emission CCFL or the like is specifically used for an excitation light source, a transparent glass tube is used. Therefore, in the configuration, the excitation light source may not make a shadow in observation from an excitation light illumination side.

On the other hand, a configuration is considered, where blue light given by blue LED is used for excitation light, and red and green phosphors are excited by the blue light, and emitted light are mixed with the excitation light, so that white light is obtained. In this case, since the blue LED being the excitation light source is neither colorless nor transparent unlike the ultraviolet lamp, if it is simply configured into the direct type, the light source itself is problematically seen from an illumination object side. Even if the light source is floated in the air, a shadow of the light source itself is made at the excitation light illumination side. Therefore, a configuration that allows observation of the excitation light illumination side has not been able to be actually achieved.

Moreover, a configuration is considered, where ultraviolet light given by ultraviolet LED is used for excitation light to obtain white light. LED using GaN (gallium nitride) has been largely developed as ultraviolet LED in the past. However, LED using ZnO (zinc oxide) is recently developed. In the ultraviolet LED using zinc oxide, a light emitting element itself may be colorless and transparent to visible light. Therefore, ultraviolet LED using zinc oxide as a main material is used, thereby a direct-type illumination device may be configured without making a shadow of a light source itself. However, unlike a rod-shaped light source such as CCFL, for example, if a flat backlight is intended to be configured using LED, LED need to be two-dimensionally arranged, and a circuit board is necessary for establishing wiring to the LED. If a structure similar to the rod-shaped light source such as CCFL or the flat backlight is achieved without using such a circuit board, the structure is practically useful. However, such a structure is not achieved yet.

In view of foregoing, it is desired to provide a light source unit, a light source device, and a display apparatus, which allow a structure similar to a rod-shaped light source such as CCFL to be achieved by using point source of light such as LED.

A light source unit according to an embodiment of the invention is used in a multiply combined manner, and includes: a light source element having a substrate and one or more light emitting elements disposed on the substrate, wherein the light source unit is configured such that when a plurality of the light source units are arranged in cascade, the light source element in the light source unit comes to in electric connection with another light source element in an adjacent light source unit.

A light source device according to an embodiment of the invention includes: a plurality of light source units, each having one or more light emitting elements and electrical connection portions, and an arrangement restriction structure restricting arrangement of the plurality of light source units so that the plurality of light source units are arranged in cascade, wherein the plurality of light source units are electrically connected to one another via the respective electrical connection portions of the light source units.

A display apparatus according to an embodiment of the invention includes: an illumination device; and a display section displaying an image with use of illumination light from the illumination device, wherein the illumination device has a plurality of rod-shaped light sources, each of the rod-shaped light sources having an optically transparent cylindrical tube with a hollow space inside thereof and having a plurality of light source units emitting light, and the light source units are arranged in cascade inside the optically transparent cylindrical tube, and the light source units adjacent to each other are electrically connected to each other.

In the light source unit according to the embodiment of the invention, when a plurality of light source units are arranged in cascade, adjacent light source elements are electrically connected to each other, so that light is emitted from a structure similar to a rod-shaped light source such as CCFL by using point source of light such as LED.

In the light source device according to the embodiment of the invention, the arrangement restriction structure restricts arrangement of a plurality of light source units, so that the plurality of light source units are arranged in cascade. The plurality of light source units are electrically connected to one another via the respective electrical connection portions. Thus, light is emitted from a structure similar to a rod-shaped light source such as CCFL by using point source of light such as LED.

In the display apparatus according to the embodiment of the invention, the plurality of light source units are arranged in cascade within the optically transparent, cylindrical tube in each of the plurality of rod-shaped light sources configuring the illumination device. In each rod-shaped light source, adjacent light source units are electrically connected to each other. Thus, light is emitted from a structure similar to a rod-shaped light source such as CCFL by using point source of light such as LED, leading to image display similar to image display given by a display apparatus using a rod-shaped light source such as CCFL as a backlight.

According to the light source unit of the embodiment of the invention, the light source unit is configured such that when a plurality of light source units are arranged in cascade, the light source element in the light source unit comes to in electric connection with another light source element in an adjacent light source unit. Therefore a structure similar to a rod-shaped light source such as CCFL is achieved by using point source of light such as LED.

According to the light source device of the embodiment of the invention, the light source device is configured such that the arrangement restriction structure restricts arrangement of a plurality of light source units, so that the plurality of light source units are arranged in cascade. In addition, the plurality of light source units are electrically connected to one another via the respective electrical connection portions. Therefore a structure similar to a rod-shaped light source such as CCFL is achieved by using point source of light such as LED.

According to the display apparatus of the embodiment of the invention, the display apparatus is configured such that a plurality of rod-shaped light sources are provided as an illumination device, and a plurality of light source units are arranged in cascade, and adjacent light source units are electrically connected to each other within an optically transparent, cylindrical tube in each of the rod-shaped light sources. Therefore light is emitted from a structure similar to a rod-shaped light source such as CCFL by using point source of light such as LED, which enables image display similar to image display given by a display apparatus using a rod-shaped light source such as CCFL as a backlight.

BRIEF DESCRIPTION OF THE DRAWINGS

FIG. 3 is an explanatory view illustrating a dimensional relationship between the light source unit according to the first embodiment of the invention and an outer tube to be inserted with the light source unit.

DETAILED DESCRIPTION OF THE PREFERRED EMBODIMENTS

Hereinafter, preferred embodiments of the invention will be described in detail with reference to drawings.

First Embodiment

Figure 1:
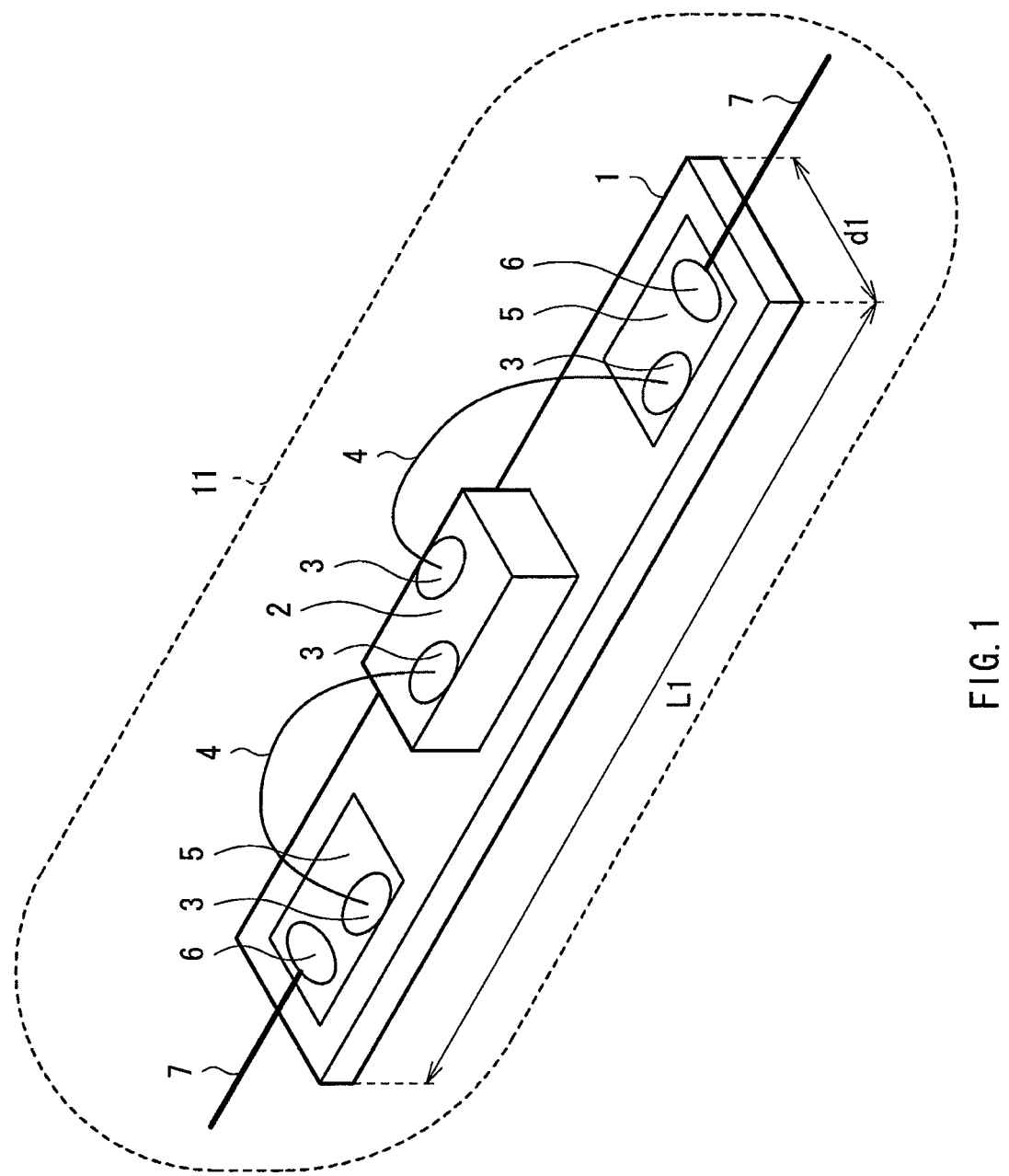
FIG. 1 is a configuration view illustrating an example of a light source device according to a first embodiment of the invention.

FIG. 1 illustrates a structure of a light source element 11 according to a first embodiment of the invention.

The light source element 11 includes a generally plate-like support substrate 1 having a rectangular surface, and an LED chip 2 disposed in the center of the support substrate 1. The support substrate 1 and the LED chip 2 are formed using, for example, zinc oxide as a main material and thus formed to be optically transparent. The LED chip 2 emits, for example, ultraviolet light. The zinc oxide may be added with MgO (magnesium oxide). Magnesium oxide is added; thereby an emission wavelength may be shortened.

In the embodiment, the light source element 11 corresponds to one of examples of the "light source" in the invention, and the LED chip 2 corresponds to one of examples of the "light emitting element" in the invention.

Moreover, substrate electrodes 5 are provided on the surface of the support substrate 1. Two substrate electrodes 5 are provided for positive and negative electrodes on both ends in a longitudinal direction. Two chip electrode-pads 3 for each of positive and negative electrodes are provided on respective surfaces of the LED chip 2 and the substrate electrodes 5. A chip electrode-pad 3 on the LED chip 2 and a chip electrode-pad 3 on each substrate electrode 5 are connected to each other by a wire 4, and thus electrically conducted. Furthermore, a terminal electrode-pad 6 is provided on the surface of each substrate electrode 5. The terminal electrode-pad 6 is connected with one end of a terminal lead-line 7. In this way, the LED chip 2 is conducted to the terminal lead-lines 7 at respective ends of the support substrate 1 via the chip electrode-pads 3, wires 4, and the substrate electrodes 5.

The light source element 11 is used as a light source unit in a multiply combined manner, and is structured such that when a plurality of the light source elements are arranged in series or in cascade as a light source unit, adjacent light source elements are electrically connected in series or in cascade to each other.

Figure 2A:
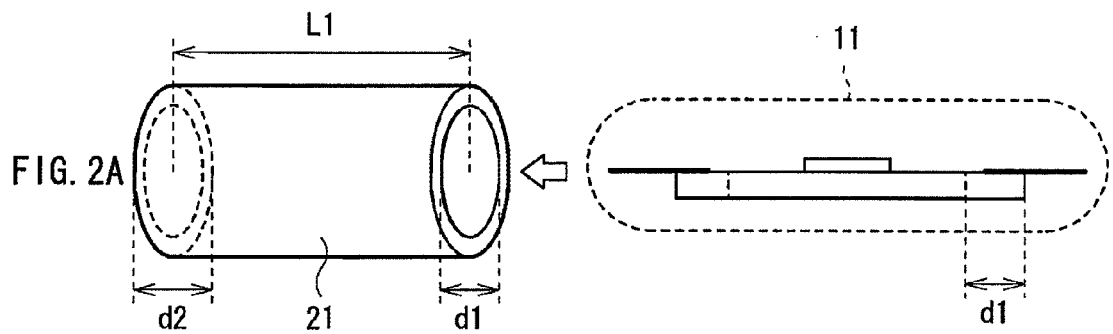
FIGS. 2A to 2D are views illustrating a configuration example of a light source unit formed by packaging the light source element according to the first embodiment of the invention, and illustrating a packaging process of the light source element.
Figure 2B:
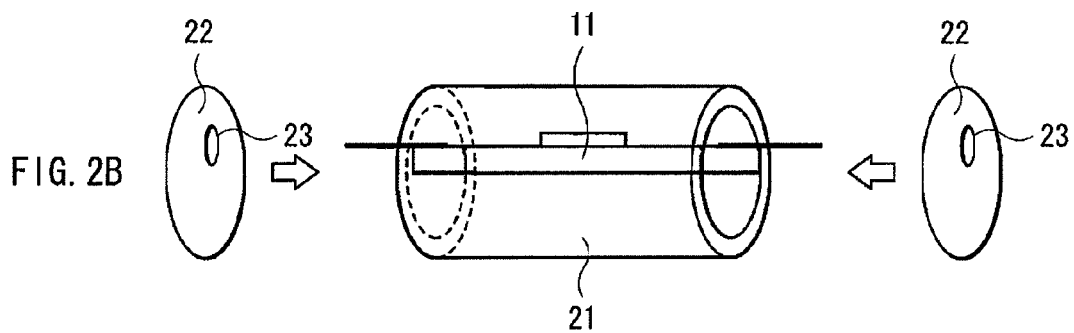
Figure 2C:
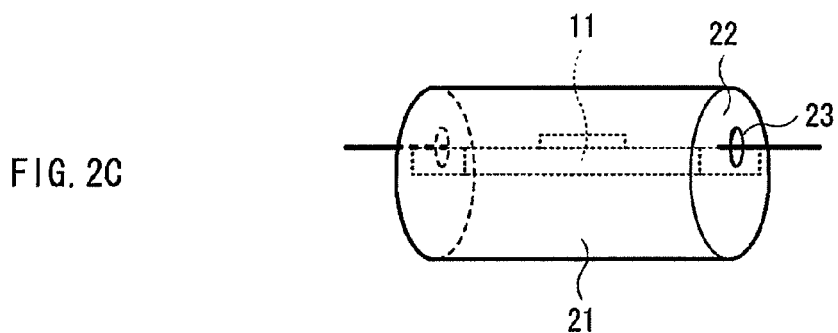
Figure 2D:
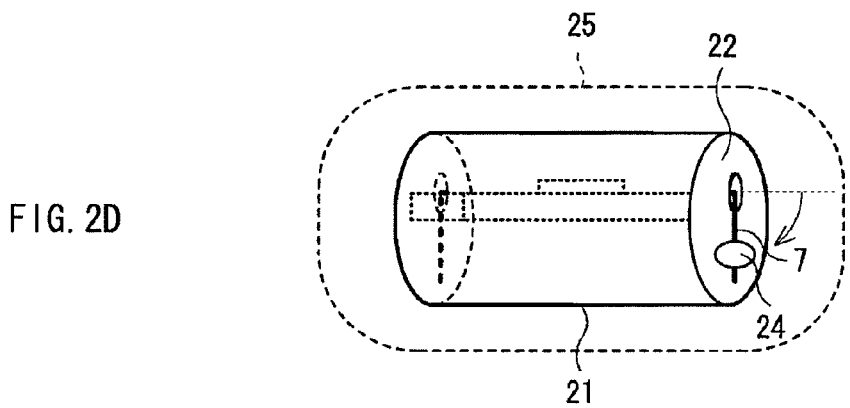

FIG. 2D illustrates a configuration example of a light source unit 25 for achieving such a structure. The light source element 11 is enclosed (packaged) within the light source unit 25. Hereinafter, the structure of the light source unit 25 is described together with a packaging process of the light source element 11 with reference to FIGS. 2A to 2D. The light source unit 25 includes a cylindrical glass tube 21 made of, for example, optically transparent quartz ($SiO_2$) glass, and a disk-like electrode plate 22 provided at each of both ends of the glass tube 21. If needed, the glass tube 21 may be made of a material opaque to ultraviolet light, or may be subjected to coating treatment or the like for filtering ultraviolet light as described later.

In the embodiment, the glass tube 21 corresponds to one of examples of the "holding member" in the invention, and the electrode plate 22 corresponds to one of examples of the "connection electrode" in the invention.

As illustrated in FIG. 2A, the glass tube 21 has a hollowed inside or a hollow space through which the light source element 11 is inserted. Length of the glass tube 21 and length of the support substrate 1 of the light source element 11 are made approximately the same, L1. In addition, an inner diameter of the glass tube 21 and width of the support substrate 1 of the light source element 11 are made approximately the same, d1. This gives a structure where the support substrate 1 is held in the air by an inner circumferential face of the glass tube 21 as illustrated in FIG. 2B.

The electrode plate 22 is optically transparent, for example, by using zinc oxide as a main material. The electrode plate 22 has a lead hole 23 to be inserted with the terminal lead-line 7 of the light source element 11. In packaging, as illustrated in FIGS. 2B and 2C, the light source element 11 is inserted into the glass tube 21, and then the electrode plate 22 is attached to each of both ends of the glass tube 21. At that time, the terminal lead-line 7 is inserted through the lead hole 23 of the electrode plate 22. Then, as illustrated in FIG. 2D, the terminal lead-line 7 is folded at either end, and welded to a welding portion 24 on an outer surface of the electrode plate 22. This provides conduction to the inner light source element 11 via the electrode plate 22, leading to a structure where in case that a plurality of light source units 25 are arranged in cascade, adjacent light source elements 11 are electrically connected in series to each other via the electrode plate 22. In this way, in the embodiment, the electrode plate 22 acts as an "electrical connection portion" for electrically connecting a plurality of light source units 25 to one another.

Figure 5:
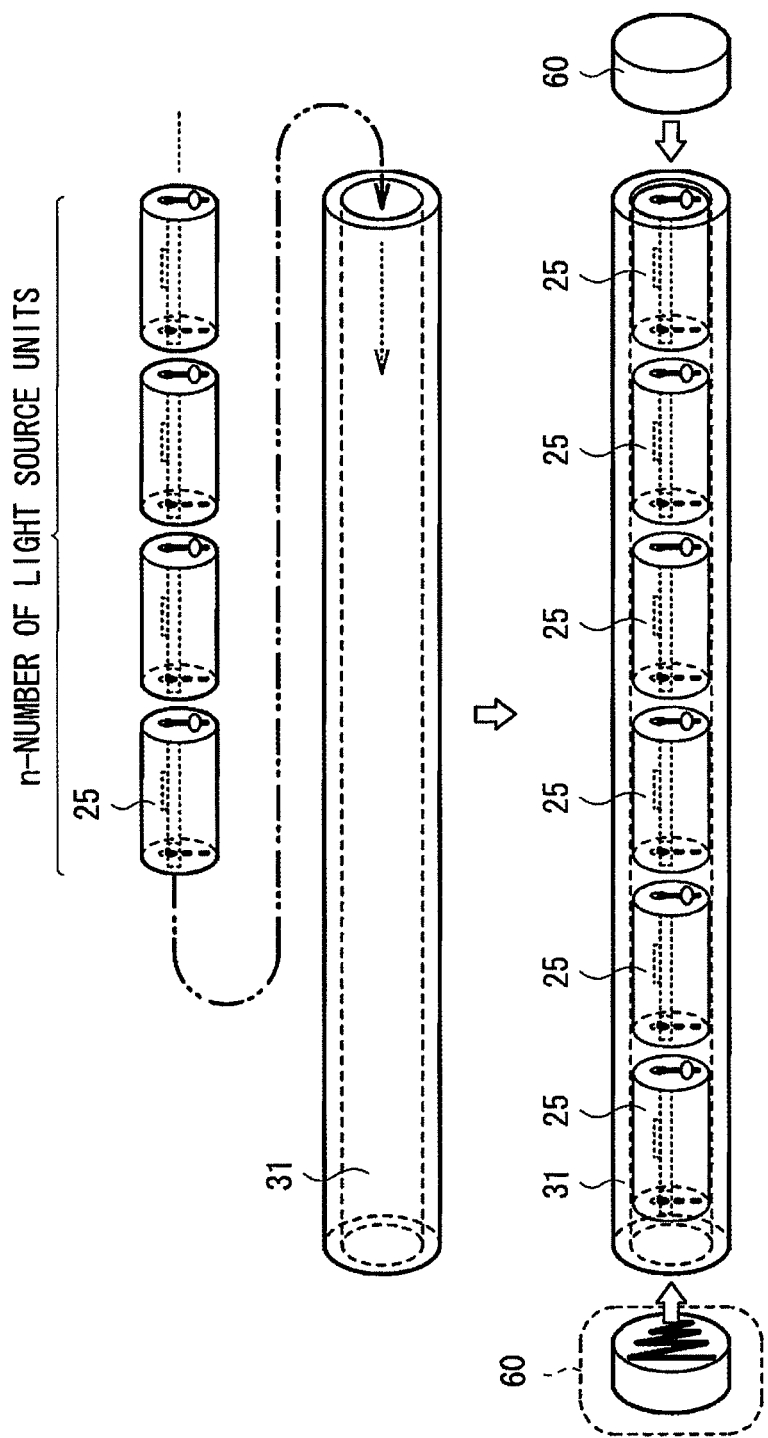
FIG. 5 is an explanatory view illustrating a state where the light source unit according to the first embodiment of the invention is inserted into the outer tube.
Figure 6:
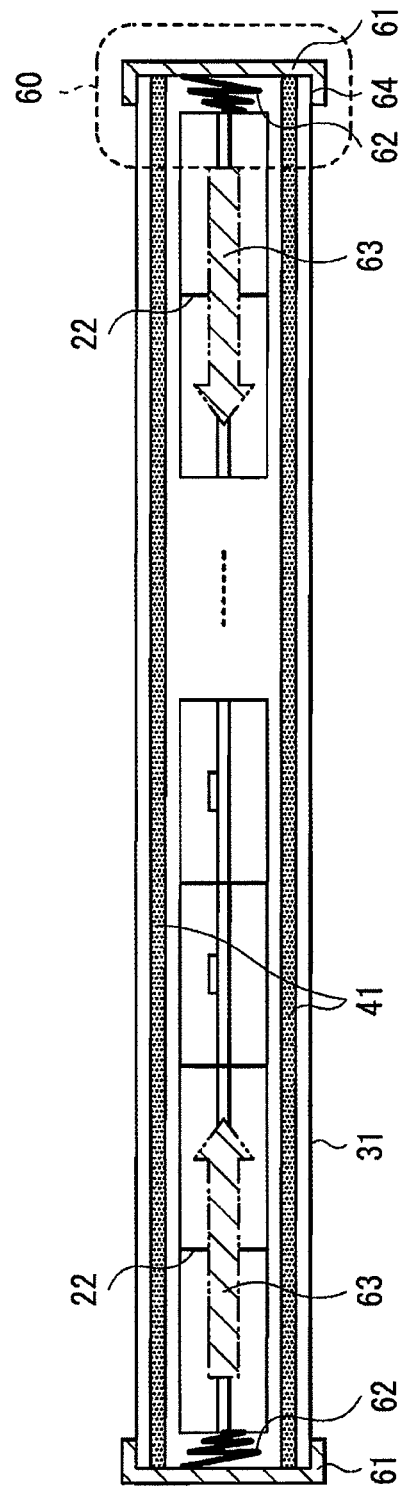
FIG. 6 is a section view illustrating a configuration example of a rod-shaped light source as a light source device according to the first embodiment of the invention.

As illustrated in FIGS. 5 and 6, a plurality (n) of the light source units 25 are combined in cascade, thereby the light source units 25 are formed into a structure similar to a bar light source or a rod-shaped light source such as CCFL as a light source device. Next, description is made on a method of forming the rod-shaped light source as the light source device by using the light source units 25 in the embodiment.

Figure 4:
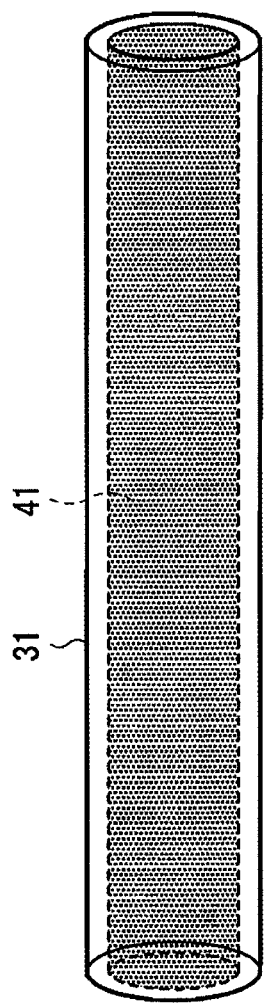
FIG. 4 is a configuration view illustrating an example of the outer tube to be inserted with the light source unit according to the first embodiment of the invention.

FIGS. 3 and 4 illustrate an example of a hollow tube (outer tube 31) used for configuring a rod-shaped light source respectively. The outer tube 31 is a cylindrical glass tube made of, for example, optically transparent quartz ($SiO_2$) glass. If needed, the outer tube 31 may be made by a material opaque to ultraviolet light, or may be subjected to coating treatment or the like for filtering ultraviolet light as described later. FIG. 3 illustrates a dimensional relationship between the outer tube 31 and the glass tube 21 of the light source unit 25. When it is assumed that the glass tube 21 of the light source unit 25 has inner diameter d1, outer diameter d2, and length L1, and the outer tube 31 has inner diameter d3, outer diameter d4, and length L2, the following dimensional relationship is given, enabling a plurality of light source units 25 to be inserted into the outer tube 31. The outer diameter d4 of the outer tube 31 is preferably set to be, for example, about 3 mm to 7 mm.

d1<d2<d3<d4

L1<L2

An inner surface of the outer tube 31 is coated with a phosphor 41 as illustrated in FIG. 4, and formed to be a fluorescent surface that is excited by light from the light source unit 25 and thereby emits fluorescent light.

A plurality of light source units 25 are inserted in cascade into such an outer tube 31 as illustrated in FIG. 5. Thus, adjacent light source units 25 are connected in cascade to each other via the electrode plate 22 at both ends of the light source unit 25. Consequently the rod-shaped light source is formed as illustrated in FIG. 6. In this way, in the embodiment, the outer tube 31 restricts arrangement of the plurality of light source units 25, and acts as an "arrangement restriction mechanism" or an "arrangement restriction structure" for arranging the plurality of light source units 25 in cascade. In the rod-shaped light source, an external electrode body 60 is provided at each end 64 of an outer tube 31. The external electrode body 60 includes an external electrode 61 using, for example, iron (Fe) or nickel (Ni) as a main material, and a crimp spring 62 attached in the inside of the external electrode 61. The crimp spring 62 has a sufficient spring property for exhibiting pressing force to keep contact between respective electrode plates 22 of adjacent light source units 25. The crimp spring 62 applies pressing force 63 to the inside, so that a contact between the light source units 25 is stabilized.

Figure 7:
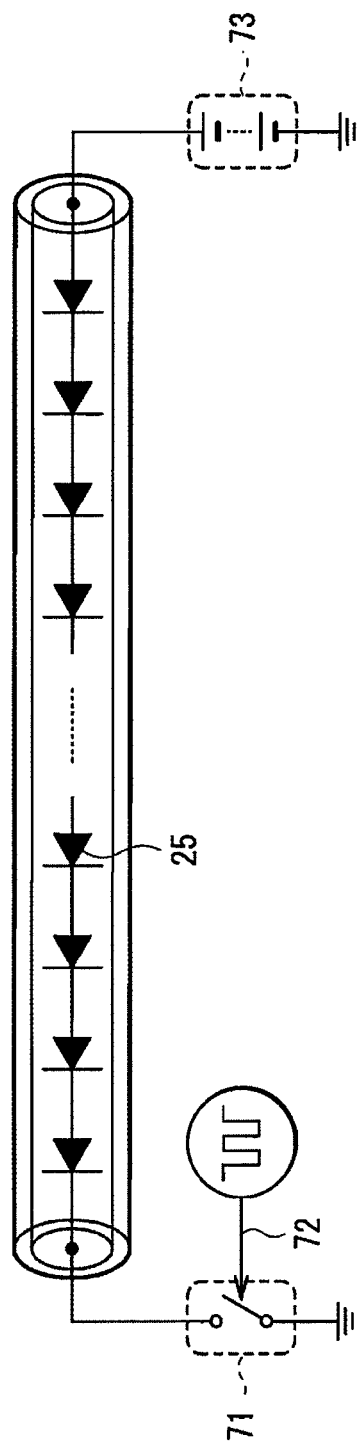
FIG. 7 is a circuit diagram illustrating an electrical equivalent circuit of the rod-shaped light source as the light source device according to the first embodiment of the invention.

FIG. 7 illustrates an electrical equivalent circuit of the rod-shaped light source. FIG. 7 illustrates an example that the rod-shaped light source emits light according to PWM (Pulse Width Modulation) control. In the example, the rod-shaped light source is connected with a power supply 73 at one end, and has a PWM switch 71 at the other end. The PWM switch 71 is controlled by a PWM signal 72, so that light emission control is performed.

Figure 8:
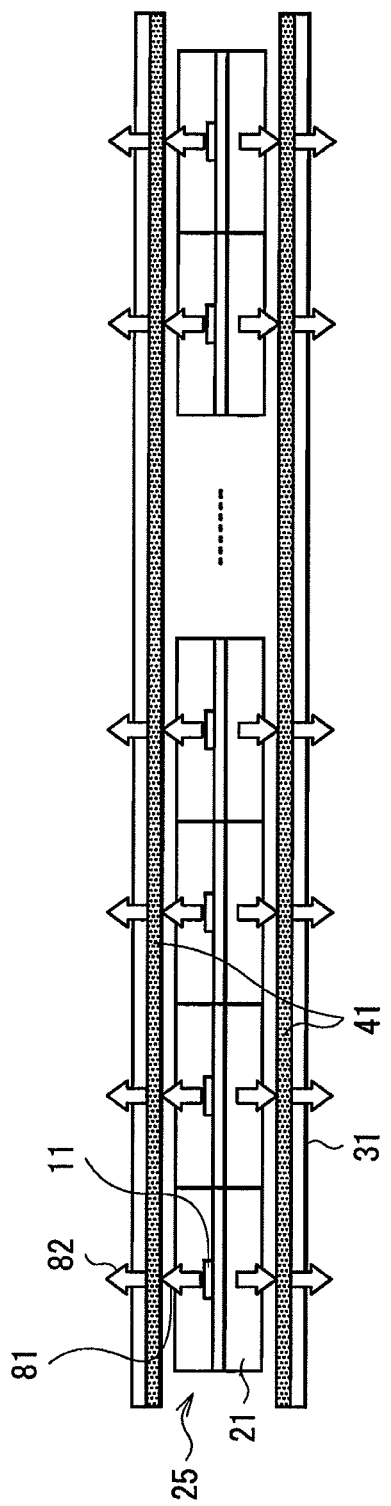
FIG. 8 is an explanatory view illustrating a light emission principle of the rod-shaped light source as the light source device according to the first embodiment of the invention.

In case of forming a white rod-shaped light source, as illustrated in FIG. 8, for example, a light source emitting ultraviolet light 81 may be used as the light source element 11 of the light source unit 25, and a phosphor that is excited by the ultraviolet light 81 and thereby emits white luminescent light may be used as the phosphor 41 on the inner surface of the outer tube 31. In this case, preferably, the glass tube 21 of the light source unit 25 transmits light in a range from ultraviolet light to visible light, and the outer tube 31 transmits visible light 82, and does not transmit the ultraviolet light 81. This provides a structure where harmful ultraviolet light 81 is cut off, and only a fluorescent light emission component (white light) is emitted to the outside as illumination light. While not illustrated, for example, a phosphor may be provided on an inner surface of the glass tube 21 configuring the light source unit 25. In this case, the following configuration may be used: the glass tube 21 transmits the visible light 82, and does not transmit the ultraviolet light 81.

In terms of light emitting efficiency, a light source element, using zinc oxide as a main material to be shifted to a relatively short wavelength, is preferably used as the light source element 11. However, in case that the light source element being shifted to a relatively short wavelength is used as a light emitting material, ozone may be considered to be generated in compensation for light emitting efficiency. In such a case, the light source element 11 is preferably placed in a vacuum for suppressing ozone generation. For example, the inside of the light source unit 25 is preferably sealed in a vacuum.

Even if the inner surface of the outer tube 31 or the inner surface of the light source unit 25 is not formed to be a fluorescent surface, and white LED is used as the light source element 11 of the light source unit 25, a white light source is formed. Furthermore, the light source device according to the embodiment is not limitedly used for the white light source, and may be used for an ultraviolet lamp. Even in case that the light source device is used as the ultraviolet lamp, the inner surface of the outer tube 31 or the inner surface of the light source unit 25 is not formed to be a fluorescent surface.

Figure 9:
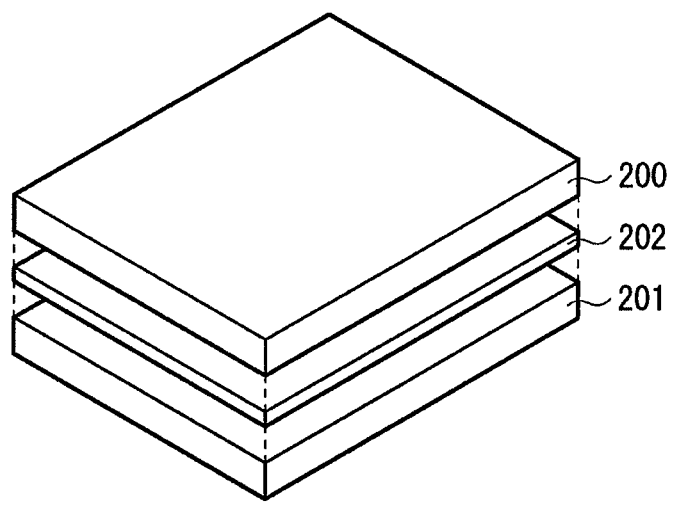
FIG. 9 is a general configuration view illustrating an example of a display apparatus using the light source device according to the first embodiment of the invention.

FIG. 9 illustrates an example of a display apparatus using the light source device (rod-shaped light source) according to the embodiment. The display apparatus is a transmissive liquid crystal display apparatus, and includes a liquid crystal panel 200, a backlight 201, and a diffuser plate 202 disposed between the backlight 201 and the liquid crystal panel 200. The backlight 201 corresponds to an illumination device, and uses the rod-shaped light source in the embodiment. The liquid crystal panel 200 corresponds to a display section that displays an image by using illumination light from the backlight 201 as light for display.

Figure 10A:
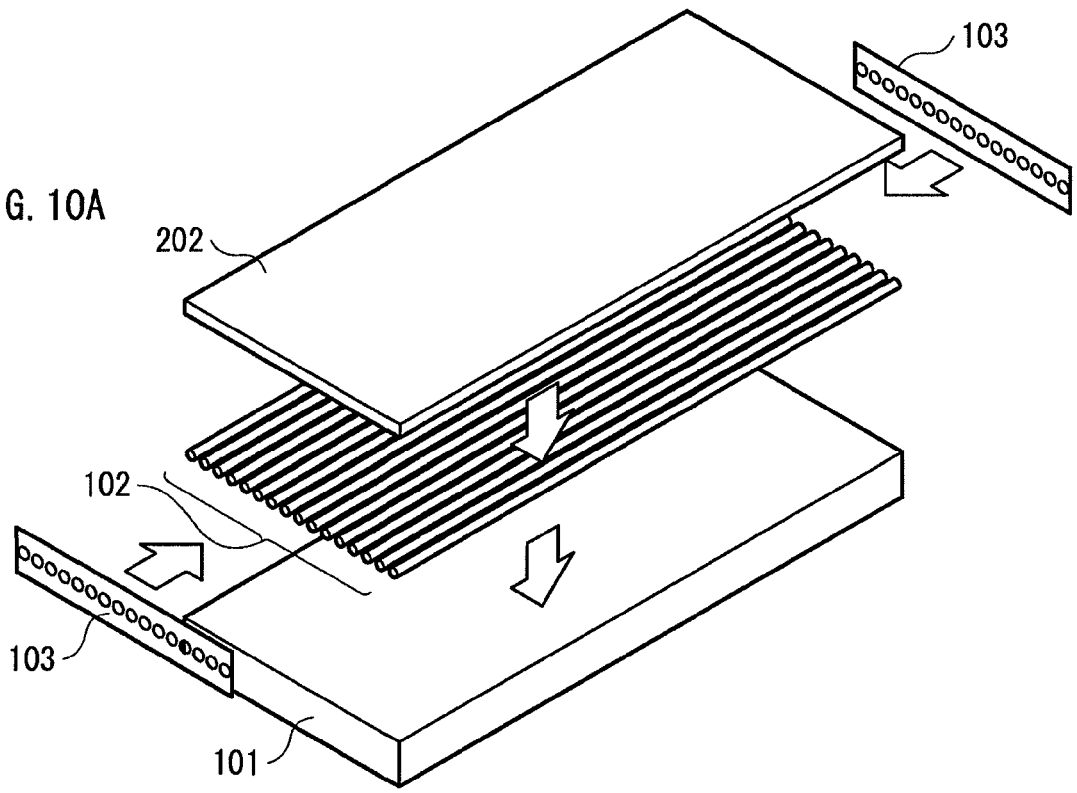
FIGS. 10A to 10B are configuration views illustrating an example of the light source device according to the first embodiment of the invention.
Figure 10B:
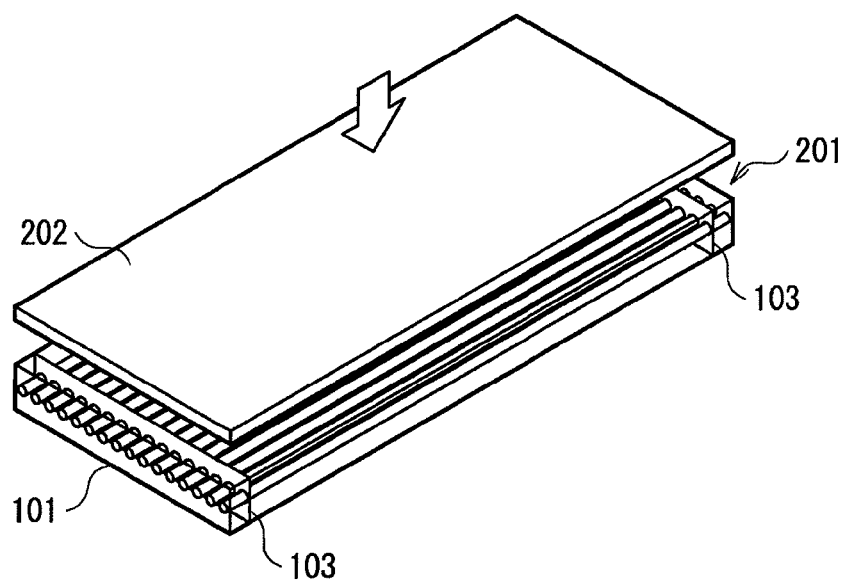

FIG. 10B illustrates a configuration example of the backlight 201. FIG. 10A illustrates a state where the backlight 201 illustrated in FIG. 10B is disassembled. The backlight 201 includes a light source group 102 including a plurality of rod-shaped light sources, and a lamp house 101 as a housing for accommodating the light source group 102. The rod-shaped light source of the embodiment is used as each of the rod-shaped light sources of the light source group 102. The light source group 102 is accommodated within the lamp house 101 while being supported by a lamp holder 103 at each of both ends.

In the display apparatus, illumination light from the backlight 201 is illuminated from a back side of the liquid crystal panel 200 via the diffuser plate 202. In the liquid crystal panel 200, the illumination light is modulated according to an image signal so that an image is displayed.

As described hereinbefore, according to the light source unit 25 and the light source device of the embodiment, the light source unit 25 and the light source device are configured such that when a plurality of the light source units 25 are arranged in cascade, the light source element 11 in the light source unit 25 comes to in electric connection with another light source element 11 in an adjacent light source unit 25. Therefore, a structure similar to a rod-shaped light source such as CCFL is achieved. Moreover, according to the display apparatus of the embodiment, since a plurality of rod-shaped light sources are provided as an illumination device, and the light source device of the embodiment is used as the rod-shaped light source, image display is performed, which is similar to image display of a previous display apparatus using a rod-shaped light source such as CCFL as a backlight.

Particularly, according to the light source unit 25 of the embodiment, since the light source unit has an electrical connection portion (the electrode plate 22) at each of both ends for electrically connecting a plurality of light source units 25 to one another, the plurality of light source units 25 are easily connected to one another. Thus, a plurality of light source elements 11 are simply electrically connected in series to one another without using a special tool.

In the case of an existent LED backlight system, since the system is structured such that a plurality of LED light source elements are directly mounted on an opaque substrate, each light source element emits light only in one direction, i.e., a surface direction of the mounting substrate. Therefore, loss is large in terms of light emitting efficiency. On the other hand, according to the light source device of the embodiment, since the light source element 11 as a whole is enclosed in a transparent tube, light is emitted even in an opposite direction (a back direction of the mounting substrate) compared with a case of the existent LED backlight system. Therefore, according to the light source device of the embodiment, when the light source device is applied to a device or the like requiring only one direction as an illumination direction such as a backlight of a display apparatus, a reflective plate may be provided on a surface opposite to a surface at an illumination object, thereby radiation loss of light is suppressed compared with the existent LED backlight system, consequently amount of apparent light emission is increased. In addition, in case that the light source device of the embodiment is used as the backlight, since the light source device is configured such that a plurality of rod-shaped light sources, each having the same appearance as that of CCFL, are separately arranged in parallel, the device has a significant advantage not only in terms of light emitting efficiency but also in terms of heat radiation efficiency compared with the existent LED backlight system. The existent LED backlight system is structured such that a plurality of LED light source elements are directly mounted on a plate-like substrate, which is disadvantageous in terms of heat radiation.

Second Embodiment

Next, a second embodiment of the invention is described. Substantially the same components as in the first embodiment are denoted by the same symbols, and description of them is appropriately omitted.

In the embodiment, a rod-shaped light source uses a non-light-emitting unit 28 emitting no light (FIGS. 11A to 11D) in addition to the light source unit 25. The non-light-emitting unit 28 may be used for adjusting an interval between the respective light source units 25 within the outer tube 31. The non-light-emitting unit 28 is approximately the same in external structure as the light source unit 25, but the light source element 11 is not enclosed therein. The non-light-emitting unit 28 includes a cylindrical glass tube 27 made of, for example, optically transparent quartz glass, and a disk-like electrode plate 22 provided at each of both ends of the glass tube 27, as in the light source unit 25.

Figure 11A:
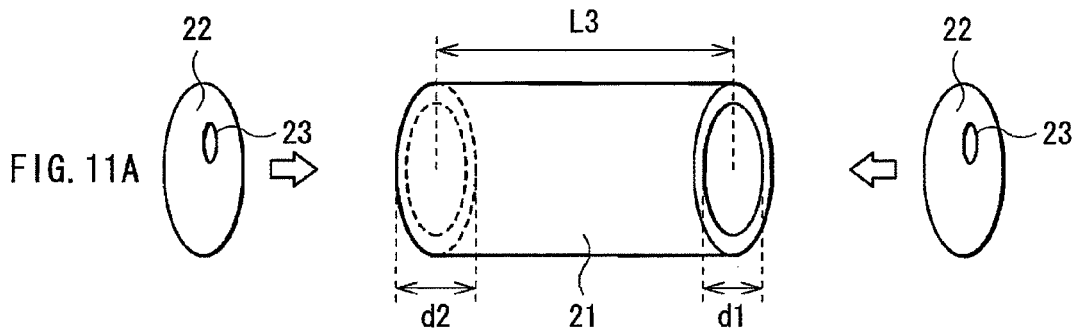
FIGS. 11A to 11D are views illustrating a configuration example of a non-light-emitting unit used in combination with a light source unit according to a second embodiment of the invention, and illustrating a packaging process of the non-light-emitting unit.
Figure 11B:
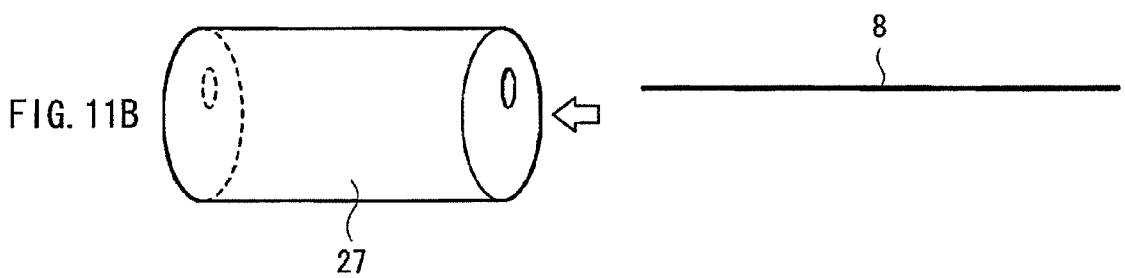
Figure 11C:
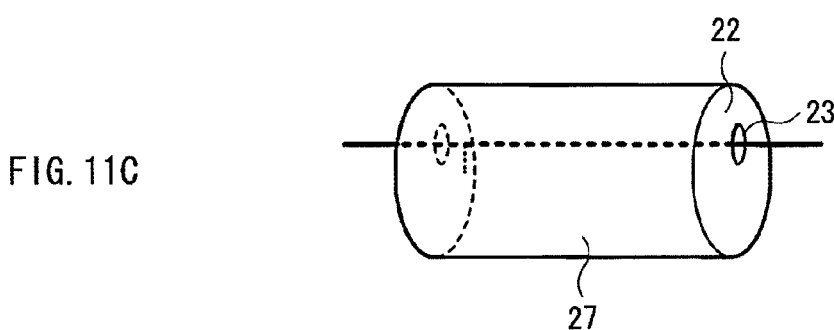
Figure 11D:
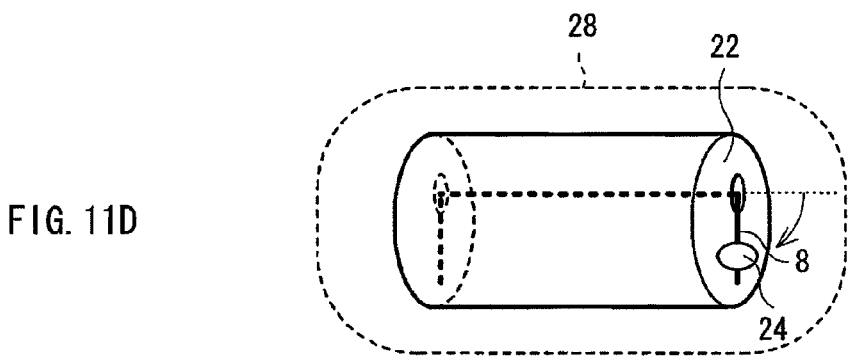

As illustrated in FIG. 11A, the glass tube 27 has a hollowed inside or a hollow space. Length L3 of the glass tube 27 is optionally set. Inner diameter d1 and outer diameter d2 of the glass tube 27 are the same as those of the glass tube 21 of the light source unit 25 respectively. The electrode plate 22 is the same as the electrode plate 22 of the light source unit 25, and has a lead hole 23. In the light source unit 25, as illustrated in FIGS. 2B and 2C, the lead hole 23 is inserted with the terminal lead-line 7 of the light source element 11 in packaging. However, in the non-light-emitting unit 28, as illustrated in FIGS. 11B and 11C, the lead hole 23 is inserted with a connection lead-line 8. Then, as illustrated in FIG. 11D, the connection lead-line 8 is folded at each of both ends, and welded to a welding portion 24 on an outer surface of the electrode plate 22. Thus, the electrode plates 22 at both ends are electrically conducted to each other via the connection lead-line 8.

Figure 12:
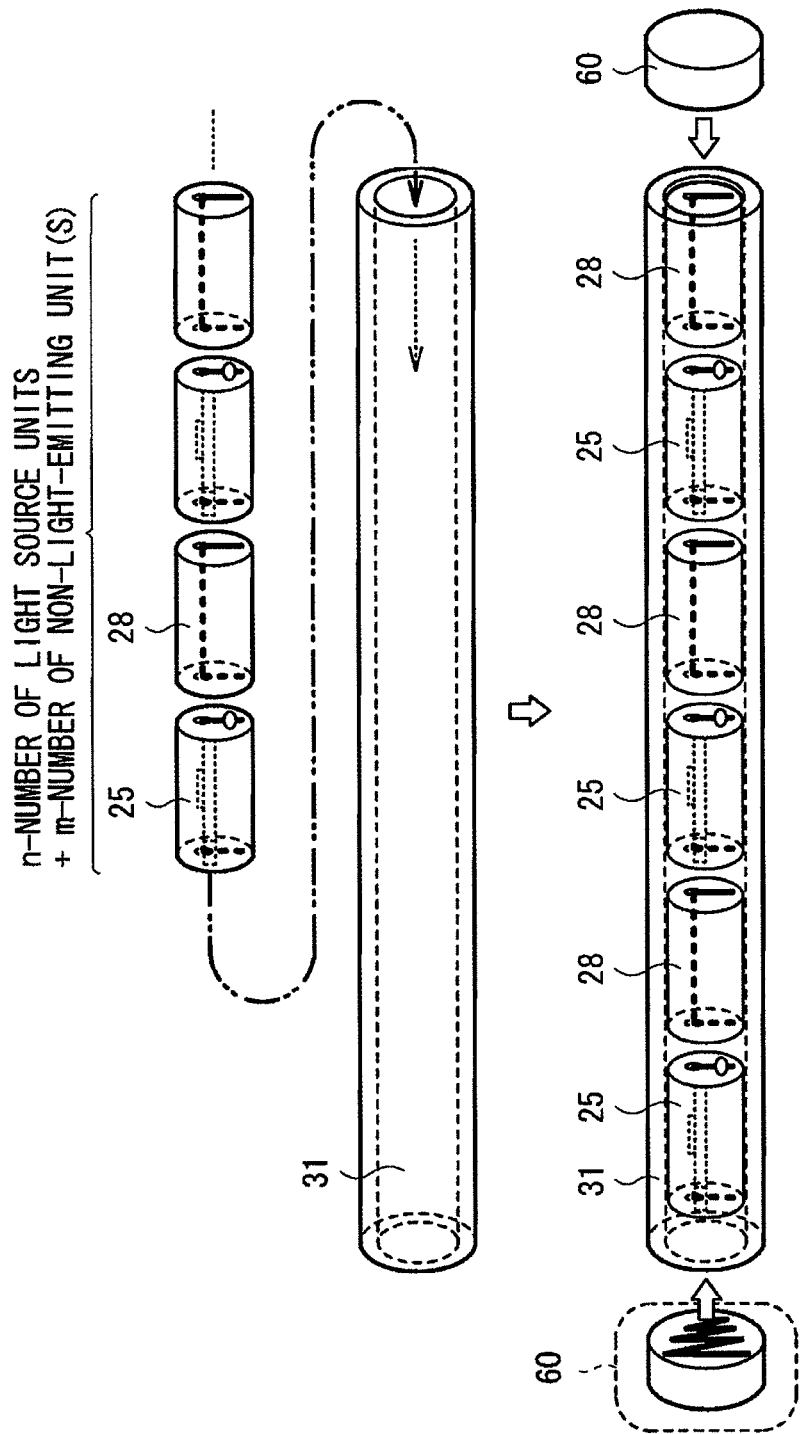
FIG. 12 is an explanatory view illustrating a state where the light source unit and the non-light-emitting unit according to the second embodiment of the invention are inserted into a glass tube (outer tube).
Figure 13:
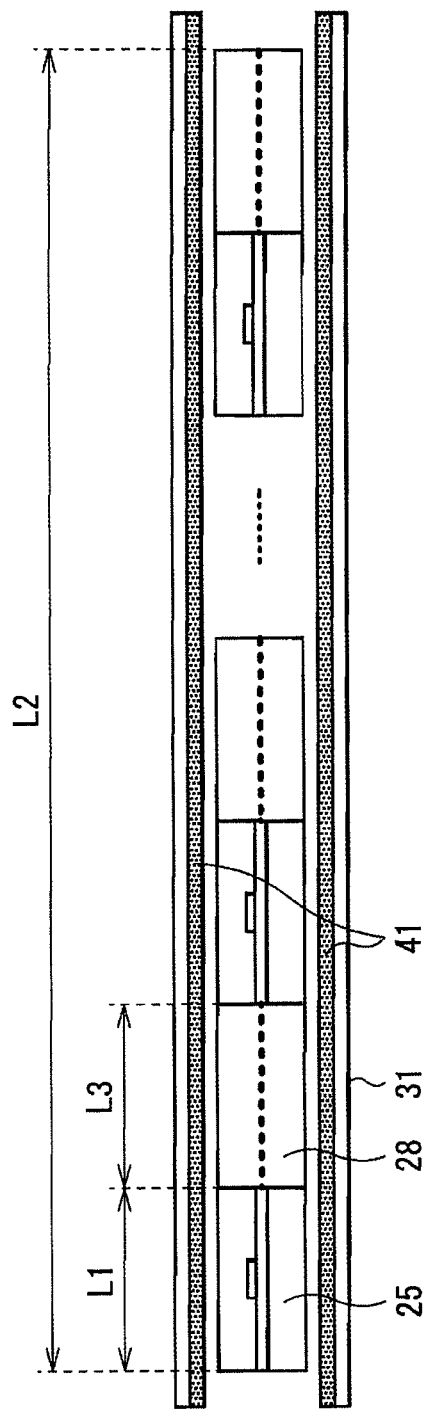
FIG. 13 is an explanatory view illustrating a dimensional relationship between each of the light source units and the non-light-emitting unit according to the second embodiment of the invention, and the glass tube (outer tube).

One or more (m) non-light-emitting units 28 and a plurality (n) of light source units 25 are combined in cascade as illustrated in FIGS. 12 and 13, thereby a structure similar to a rod-shaped light source such as CCFL is formed as a light source device. In this case, the non-light-emitting units 28 for interval adjustment are arranged in cascade with the light source units 25, and adjacent light source units 25 are electrically connected in series to each other partially via the non-light-emitting unit 28 (a plurality of light source units 25 are separately arranged with the non-light-emitting unit 28 being partially interposed between them) within the outer tube 31. In this way, the rod-shaped light source is the same in basic structure as in the first embodiment except that the non-light-emitting unit 28 is partially used.

Figure 14:
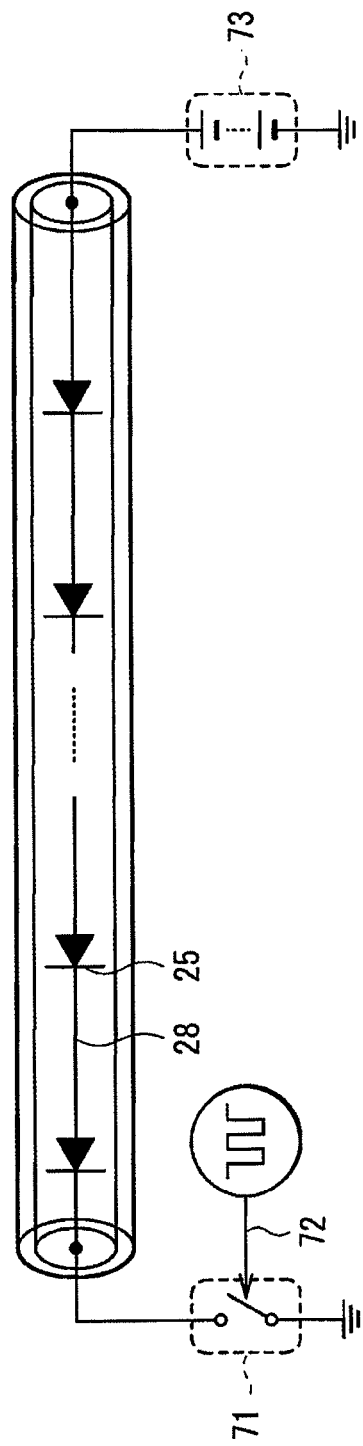
FIG. 14 is a circuit diagram illustrating an electrical equivalent circuit of a rod-shaped light source as a light source device according to the second embodiment of the invention.

FIG. 14 illustrates an electrical equivalent circuit of the rod-shaped light source of the embodiment. FIG. 14 illustrates an example that the rod-shaped light source emits light according to PWM control as in the first embodiment (FIG. 7). The circuit configuration is the same as in the first embodiment except that a portion corresponding to the non-light-emitting unit 28 is expressed as a conductor line.

Third Embodiment

Next, a third embodiment of the invention is described. Substantially the same components as in the above embodiments are denoted by the same symbols, and description of them is appropriately omitted.

Figure 15:
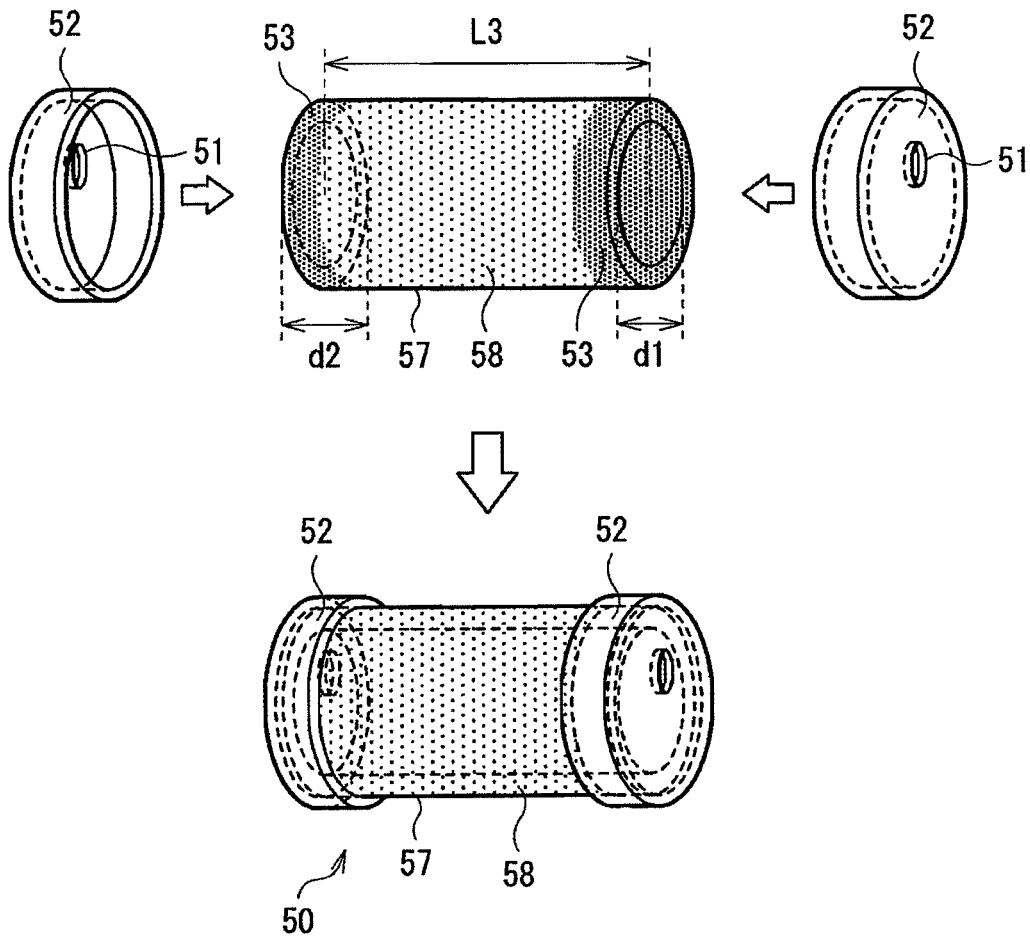
FIG. 15 is a view illustrating a configuration example of a non-light-emitting unit used in combination with a light source unit according to a third embodiment of the invention, and illustrating a packaging process of the non-light-emitting unit.
Figure 16:
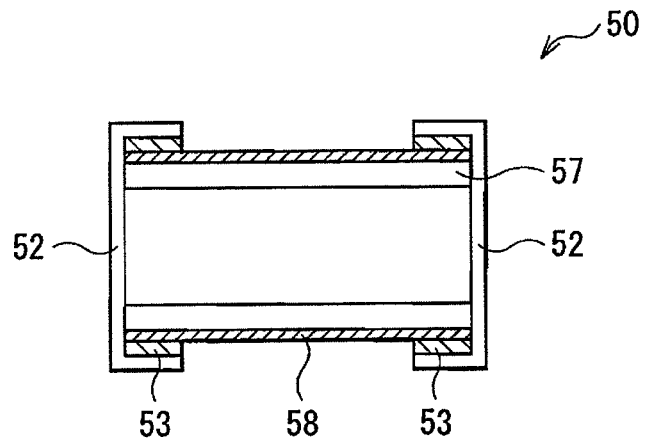
FIG. 16 is a section view illustrating a configuration example of the non-light-emitting unit used in combination with the light source unit according to the third embodiment of the invention.

In the embodiment, a rod-shaped light source uses a non-light-emitting unit 50 emitting no light (FIGS. 15 to 16) in addition to the light source unit 25 as in the second embodiment. The non-light-emitting unit 50 may be used for adjusting an interval between the respective light source units 25 within the outer tube 31 as in the non-light-emitting unit 28 of the second embodiment. The non-light-emitting unit 50 is approximately the same in overall structure as the light source unit 25, but the light source element 11 is not enclosed therein. The non-light-emitting unit 50 includes a cylindrical glass tube 57 made of, for example, optically transparent quartz glass, and an electrode cap 52 provided at each of both ends of the glass tube 57 similarly as the light source unit 25.

The glass tube 57 is covered with an optically transparent, transparent conductive film (such as ITO) 58 over an outer surface thereof. In a case that a light source element emitting ultraviolet light is used as the light source element 11, the transparent conductive film 58 is preferably made of a material being transparent not only to visible light but also ultraviolet light. The electrode cap 52 is adhered to each of both ends of the glass tube 57 by a conductive adhesive 53. The electrode cap 52 has an air hole 51. For the electrode cap 52, light-reflective metal (aluminum) or the like is used. However, a transparent electrode cap 52 may be formed by using ITO-coated glass or the like. In this way, the non-light-emitting unit 50 has a structure where the entire surface is covered with a material being electrically conductive.

One or more (m) non-light-emitting units 50 and a plurality (n) of light source units 25 are combined in cascade as in the second embodiment, thereby a structure similar to a rod-shaped light source such as CCFL is formed as a light source device. In this case, the non-light-emitting units 50 for interval adjustment are arranged in cascade with the light source units 25, and adjacent light source units 25 are electrically connected in series to each other partially via the non-light-emitting unit 50 within the outer tube 31. The rod-shaped light source in the embodiment is the same in basic structure as in the first embodiment except that the non-light-emitting unit 50 is partially used.

Fourth Embodiment

Next, a fourth embodiment of the invention is described. Substantially the same components as in the above embodiments are denoted by the same symbols, and description of them is appropriately omitted.

Figure 17:
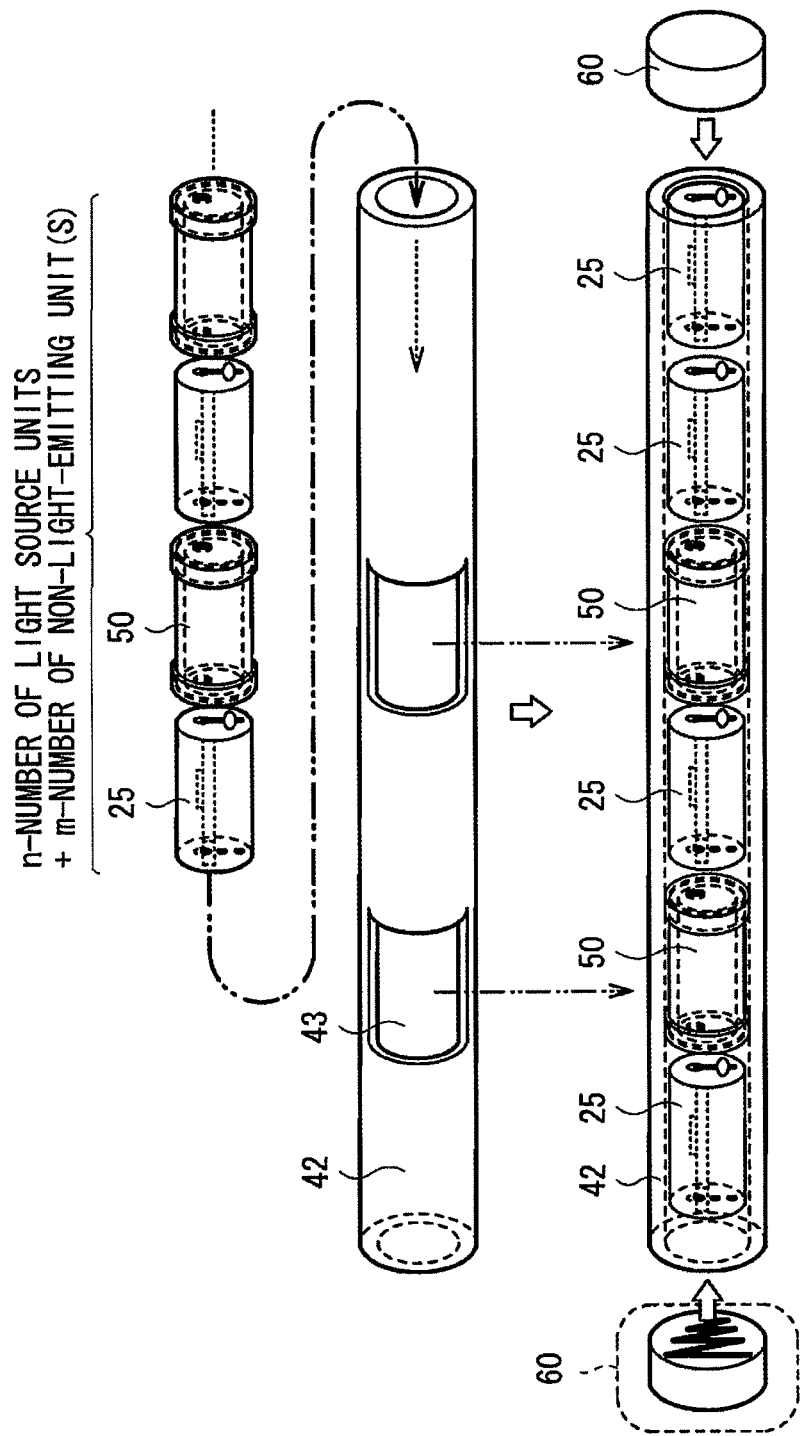
FIG. 17 is an explanatory view illustrating a state where a light source unit and a non-light-emitting unit according to a fourth embodiment of the invention are inserted into a glass tube (outer tube).
Figure 18:
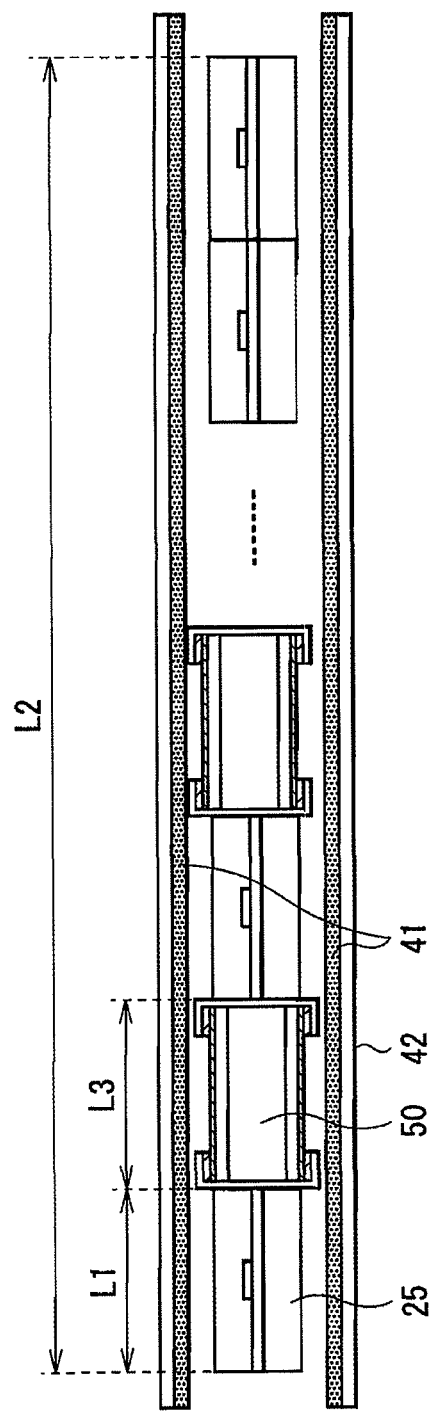
FIG. 18 is an explanatory view illustrating a dimensional relationship between each of the light source units and the non-light-emitting unit according to the fourth embodiment of the invention, and the glass tube (outer tube).

In the embodiment, the non-light-emitting unit 50 in the third embodiment is used as an electrical contact for lead-out to the outside. FIGS. 17 and 18 illustrate a configuration example of a rod-shaped light source according to the embodiment respectively. The rod-shaped light source of the embodiment has a cut-hole-formed outer tube 42 partially having a cut hole 43 in place of the outer tube 31 in the first embodiment. The non-light-emitting unit 50 and the light source unit 25 are accommodated within the cut-hole-formed outer tube 42. The non-light-emitting unit 50 is disposed at a position corresponding to the cut hole 43. Thereby, an electrical contact to the outside is formed at the non-light-emitting unit 50. Size of the cut hole 43 is formed small compared with size of each of the non-light-emitting unit 50 and the light source unit 25 so that each of the non-light-emitting unit 50 and the light source unit 25 does not fall off from the inside of the outer tube 42 to the outside.

Figure 19:
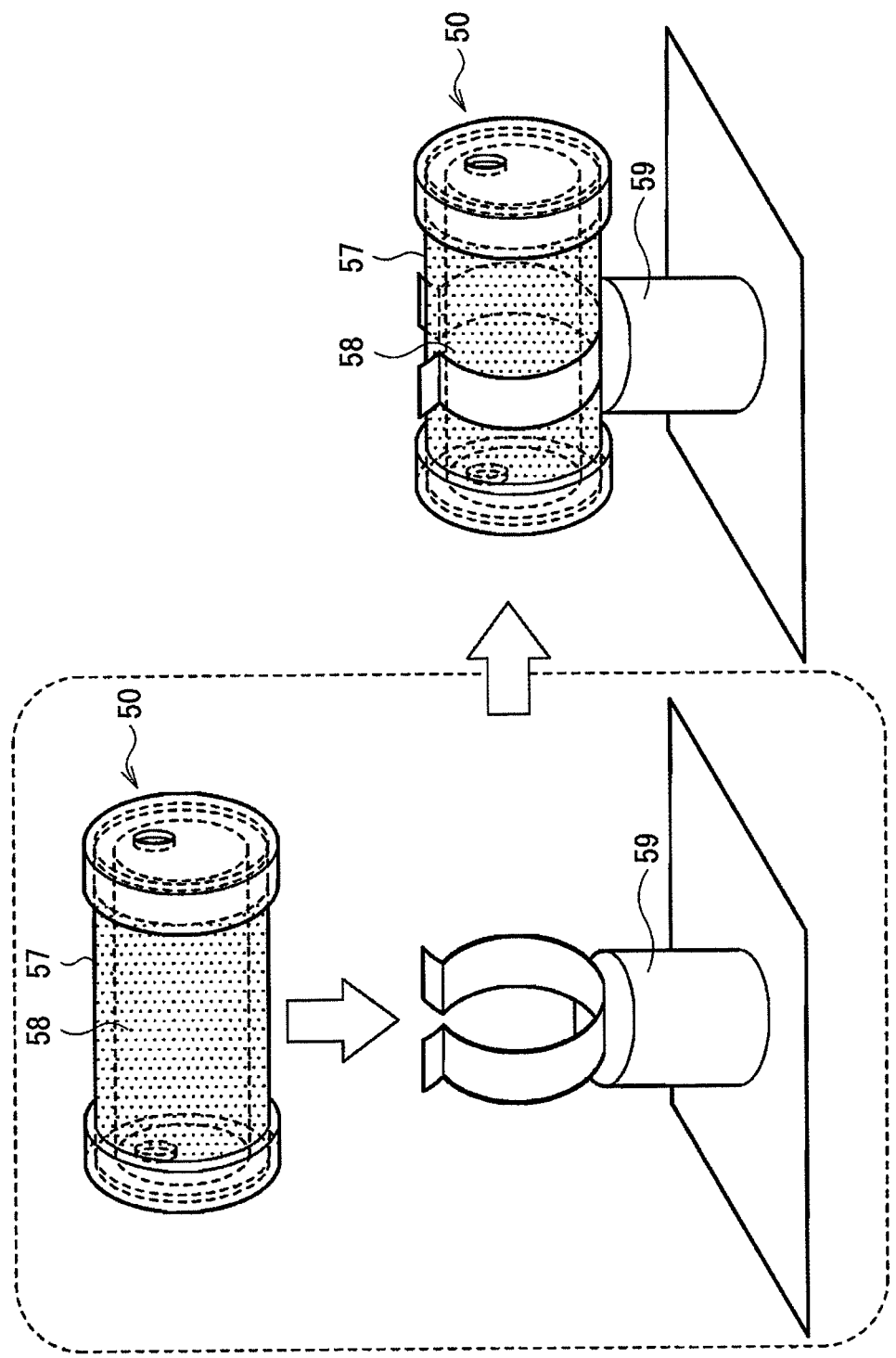
FIG. 19 is a structural view illustrating an example of a contact structure of the non-light-emitting unit according to the fourth embodiment of the invention.

The electrical contact to the outside may be achieved by, for example, a clamp mechanism or a clamp structure as illustrated in FIG. 19. In the clamp structure, a holder (clamp) 59 is used to hold the non-light-emitting unit 50 from the outside of the outer tube 42 via the cut hole 43. The holder 59 is made conductive. Thereby, electrical conduct from the outside of the outer tube 42 is made via the holder 59.

Figure 20:
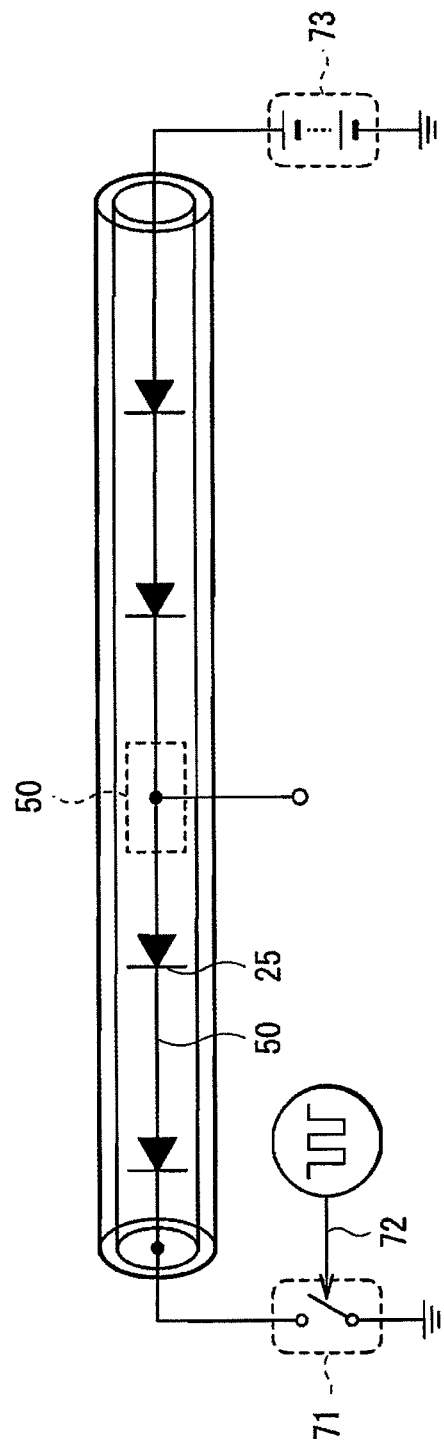
FIG. 20 is a circuit diagram illustrating an electrical equivalent circuit of a rod-shaped light source as a light source device according to the fourth embodiment of the invention.

FIG. 20 illustrates an electrical equivalent circuit of the rod-shaped light source of the embodiment. FIG. 20 illustrates an example that the rod-shaped light source emits light according to PWM control as in the first embodiment (FIG. 7). The circuit configuration is basically the same as in the first embodiment except that a portion corresponding to the non-light-emitting unit 50 is expressed as a conductor line. However, an optional non-light-emitting unit 50 is made as the electrical contact to the outside.

When the light source unit 25 is assumed as one light source, the rod-shaped light source as a light source device of the embodiment may be considered to be an assembly of a plurality of single light sources. In addition, the above electrical contact is provided. Thereby a light source unit 25 in any region is turned on. Therefore, the light source device of the embodiment may be used for a partial-driving LED backlight.

Figure 28:
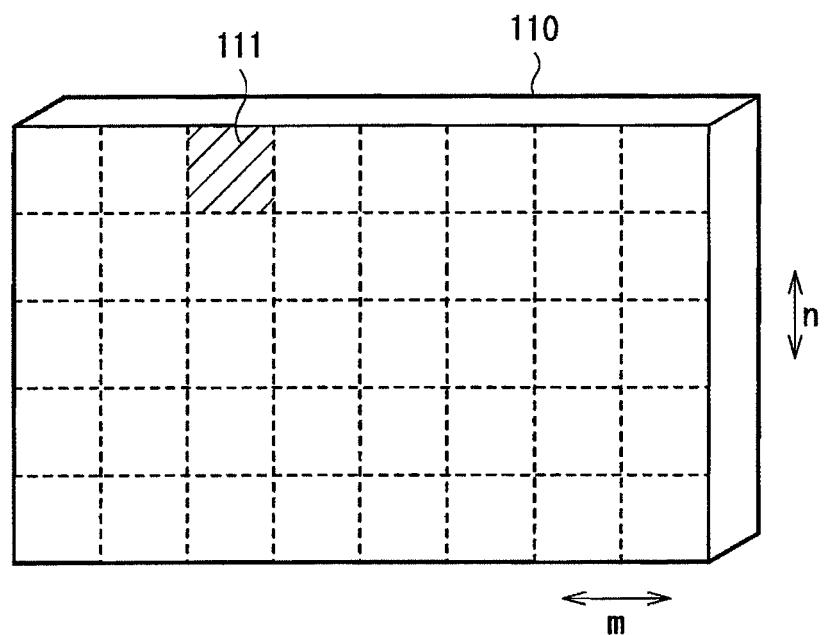
FIG. 28 is an explanatory view of a backlight that partially emits light.

FIG. 28 illustrates a concept of the partial-driving LED backlight. In the backlight 110, a light-emitting area of the entire screen is divided into a plurality of partial light-emitting areas 111 of n in row and m in column, and light emission control is independently made for each partial light-emitting area 111. In a display apparatus using the partial-driving LED backlight, since luminance of a backlight is partially changed depending on an image to be displayed, an image having relatively high quality is displayed. By using the light source device of the embodiment, since partial light emission is made even in a rod-shaped light source, it is possible to establish such a partial-driving LED backlight.

Fifth Embodiment

Next, a fifth embodiment of the invention is described. Substantially the same components as in the above embodiments are denoted by the same symbols, and description of them is appropriately omitted.

Figure 21:
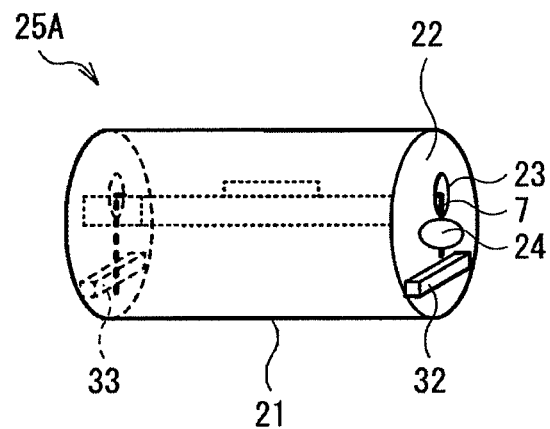
FIG. 21 is a configuration view illustrating an example of a light source unit according to a fifth embodiment of the invention.

FIG. 21 illustrates an example of a light source unit 25A according to the embodiment.

Figure 22:
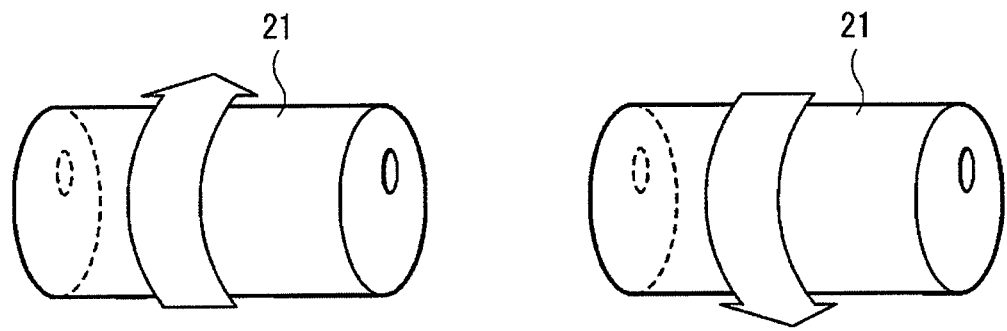
FIG. 22 is an explanatory view illustrating a difficulty in case that the light source unit according to the fifth embodiment of the invention is not used.

In the embodiment, a prevention structure is provided at each of both ends (electrode plate 22) of the light source unit 25A for preventing displacement between adjacent light source units. A convex portion 32 and a concave portion 33 are provided as the prevention structure in the electrode plate 22 at each of both ends. In a case that the electrode plate 22 at each of both ends is flat, when a plurality of light source units 25A are combined, since each glass tube is freely rotated as illustrated in FIG. 22, a mutual position between the electrode plates 22 is not fixed. On the other hand, in the embodiment, the structure as illustrated in FIG. 21 is made, thereby when a plurality of light source units 25A are combined, since the convex portion 32 and the concave portion 33 are engaged with each other between adjacent light source units 25A, the displacement is prevented.

Figure 23:
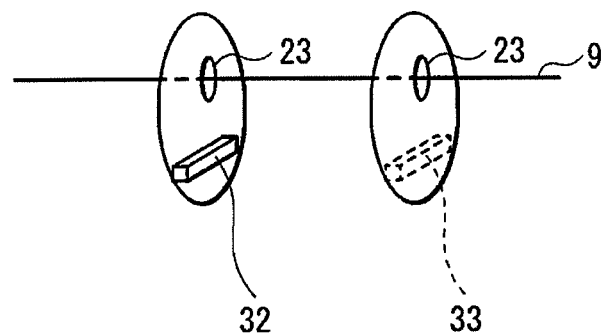
FIG. 23 is an explanatory view illustrating an advantage of using the light source unit according to the fifth embodiment of the invention.

In a case that the light source unit 25A of the embodiment is to be inserted into an outer tube 31, a step is performed where a wire-like lead line 9 is beforehand inserted through a lead hole 23 of the electrode plate 22 as illustrated in FIG. 23, and the lead line 9 is pulled out later. Thereby, the convex portion 32 and the concave portion 33 between the light source units 25A are engaged with each other in the outer tube 31 so that the displacement is securely prevented, and consequently the light source unit is easily processed and assembled. In this case, the lead line 9 preferably includes a material having high hardness so as to provide high bending resistance. This reduces a stroke to the utmost, the stroke being a rotation stroke of the light source unit 25A in a tube diameter direction within the outer tube 31. Therefore, the light source unit 25A is positioned with respect to a different light source unit 25A, being previously accommodated in the outer tube 31, concurrent with insertion of a light source unit 25A into the outer tube 31.

In a case that a plurality of light source units 25A are to be accommodated in the outer tube 31, before a light source unit 25A is accommodated, an electrode plate 22 at each of both ends of the light source unit may be beforehand engaged with an electrode plate 22 at each of both ends of a different light source unit, and the light source units 25A may be accommodated step by step. This also enables secure electrical connection between a plurality of light source units 25A within the outer tube 31.

Sixth Embodiment

Next, a sixth embodiment of the invention is described. Substantially the same components as in the above embodiments are denoted by the same symbols, and description of them is appropriately omitted.

Figure 24:
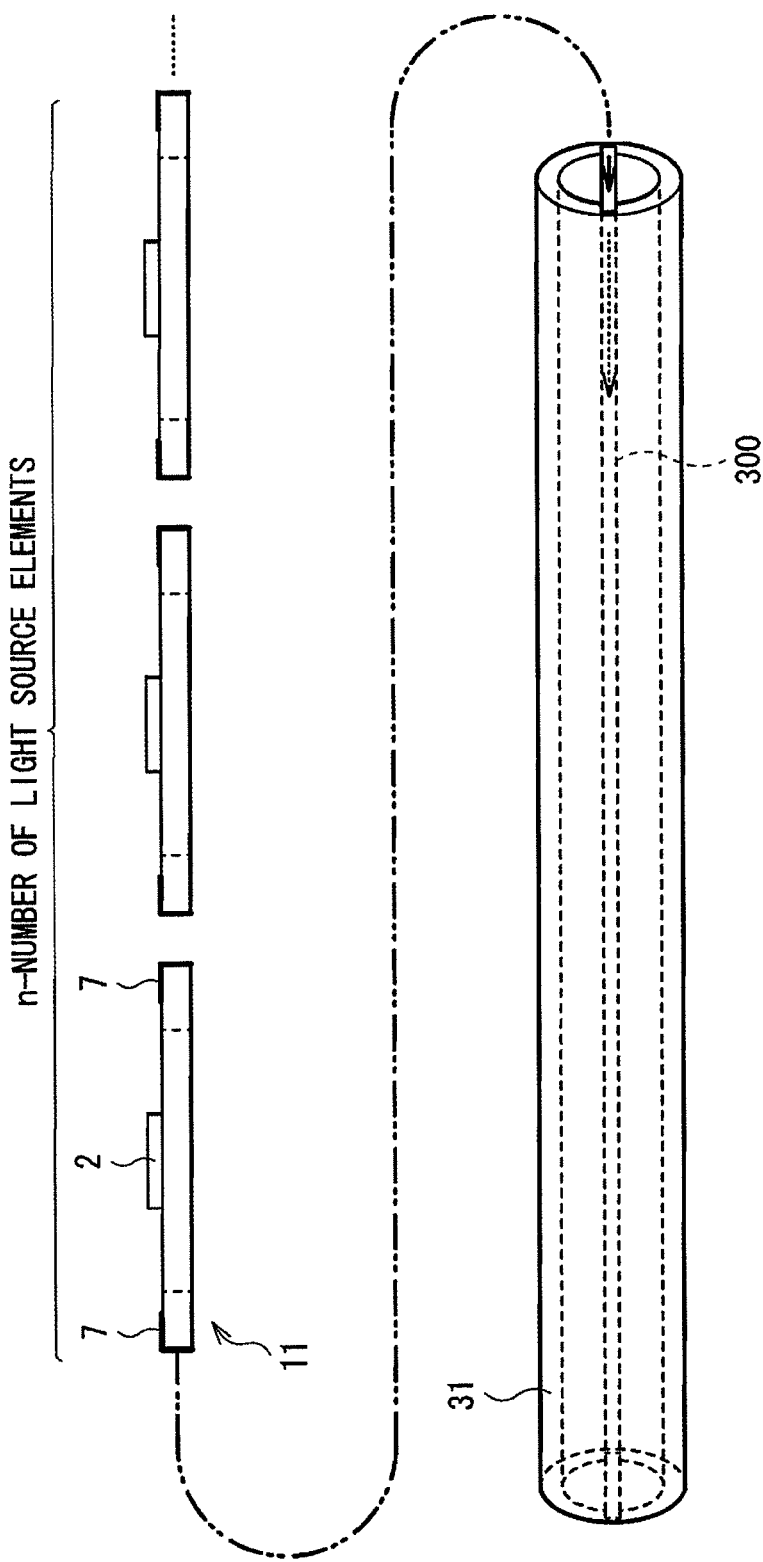
FIG. 24 is a view illustrating a configuration example of a rod-shaped light source as a light source device according to a sixth embodiment of the invention.

FIG. 24 illustrates a configuration example of a rod-shaped light source according to the embodiment.

In the embodiment, a light source element 11 itself is used as a light source unit. In the embodiment, a groove 300 is provided on an inner surface of the outer tube 31, and a light source element 11 is inserted into the outer tube in such a manner that a support substrate 1 is sandwiched in the groove 300. In the embodiment, respective ends of adjacent light source elements 11 are directly conducted to each other via a terminal lead-line 7 within the outer tube 31.

Seventh Embodiment

Next, a seventh embodiment of the invention is described. Substantially the same components as in the above embodiments are denoted by the same symbols, and description of them is appropriately omitted.

Figure 25:
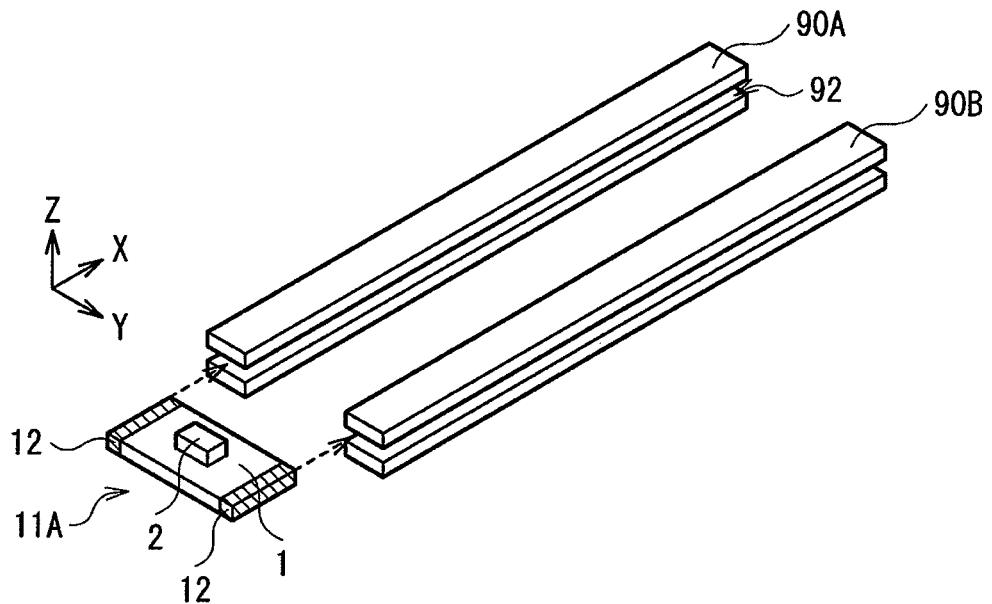
FIG. 25 is a configuration view illustrating an example of an arrangement restriction structure in a light source device according to a seventh embodiment of the invention.

In the above embodiments, the cylindrical tube is used for an arrangement restriction structure for arranging the light source units in cascade. However, in the embodiment, rail-shaped guide members 90A and 90B are used for the arrangement restriction structure as illustrated in FIG. 25. In addition, the embodiment uses a light source element 11A itself as a light source unit. Two guide members 90A and 90B are arranged in parallel. Grooves 92 are provided on at least opposed inside portions of the two guide members 90A and 90B arranged in parallel respectively.

Figure 26:
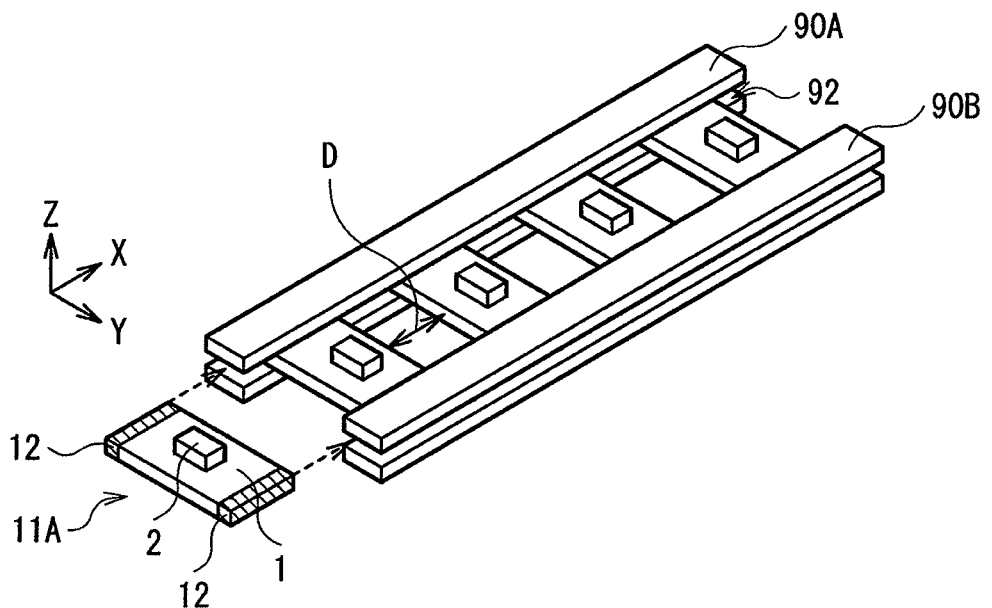
FIG. 26 is a configuration view illustrating an example of a light source device according to the seventh embodiment of the invention.

FIG. 26 illustrates a configuration example where a plurality of light source elements 11A are arranged in cascade by using the guide members 90A and 90B. In the embodiment, two guide members 90A and 90B are arranged in parallel, and a plurality of light source elements 11A are accommodated in such a manner that each of both ends of a light source element 11A is slid into the groove 92. An arrangement interval (interval in a Y direction in the figure) between the two guide members 90A and 90B arranged in parallel is set small compared with a size of the light source element 11A, so that each of both ends of a light source element 11A may be held between the guide members. In (a support substrate 1 of) each light source element 11A, an electrical connection portion 12 is formed for connecting an LED chip 2 to the outside or to a different light source element 11A at each of both ends in a direction (Y direction in the figure) perpendicular to an arrangement direction (X direction in the figure) of a plurality of light source elements 11A. Moreover, a current path to be connected to the electrical connection portion 12 is formed in the groove 92 of each of the guide members 90A and 90B. Thus, when a plurality of light source elements 11A are accommodated into the guide members 90A and 90B, the light source elements are electrically connected to one another via electrical connection portions 12 at both ends of respective elements and respective current paths of the guide members 90A and 90B.

In the configuration example of FIG. 26, since the plurality of light source elements 11A are electrically connected to one another via the respective current paths formed in the guide members 90A and 90B, adjacent light source elements 11A are not necessary to be directly contacted to each other, and an optional interval D may be provided between the plurality of light source elements 11A. Therefore, a non-light-emitting element or the like is also unnecessary to be provided for adjusting an interval. In the configuration example of FIG. 26, the interval D is provided between all of the light source elements 11A. However, the light source elements may be arranged such that a part or all of the light source elements 11A are contacted to one another, that is, the interval D is zero.

In the configuration example of FIG. 26, in a case that the respective current paths formed in the guide members 90A and 90B act as common electrodes of the respective electrical connection portions 12 of the plurality of light source elements 11A, the plurality of light source elements 11A have a parallel electrical-connection relationship in an X direction in the figure. The case that the current paths act as the common electrodes described herein means, for example, a case of a configuration where a current path is continuously formed in the groove 92 of each of the guide members 90A and 90B, and a current path in one guide member 90A is used to commonly connect between electrical connection portions 12 at respective one ends of the plurality of light source elements 11A, and a current path in the other guide member 90B is used to commonly connect between electrical connection portions 12 at respective other ends of the plurality of light source elements 11A.

On the other hand, in the configuration example of FIG. 26, the plurality of light source elements 11A may also be made to have a series electrical-connection relationship. For example, a pattern may be formed as a current path formed in each of the guide members 90A and 90B, in which a conductive region and an insulative region alternately appear in correspondence to an arrangement interval between the plurality of light source elements 11A. In this case, when it is assumed that a current sequentially flows through the plurality of light source elements 11A from a near side to a back side in the X direction in FIG. 26, a direction (polarity) of the current is alternately changed in a Y direction within each light source element 11A (current directions in the Y direction is opposed to each other between adjacent light source elements 11A), consequently the current flows in a zigzag.

Figure 27:
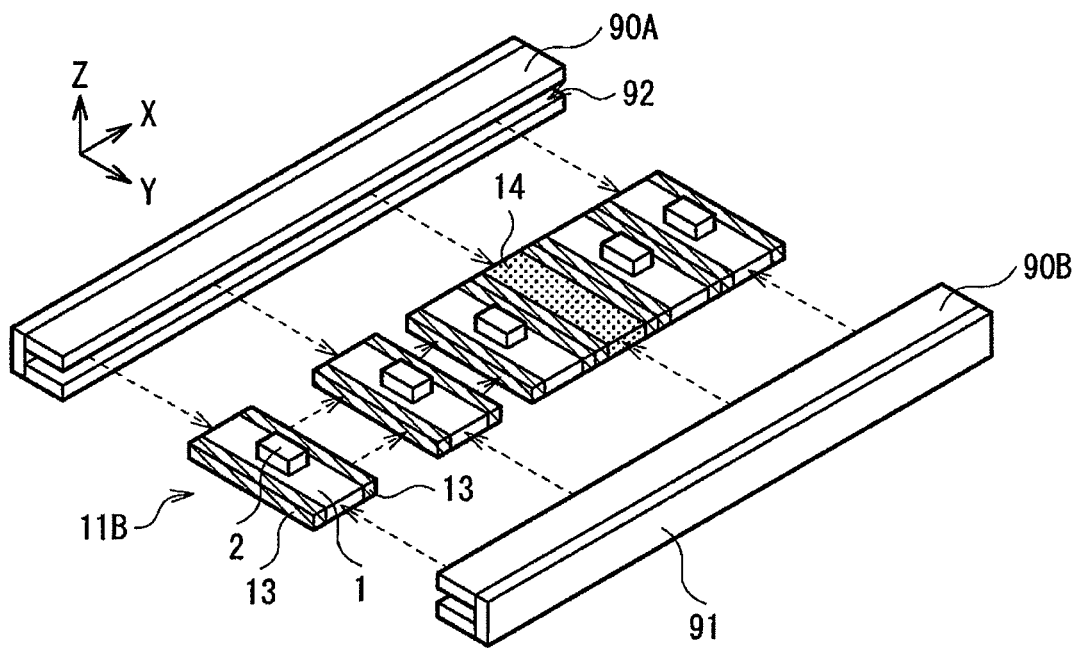
FIG. 27 is a configuration view illustrating another example of the light source device according to the seventh embodiment of the invention.

FIG. 27 illustrates another configuration example of a light source device of the embodiment. In this configuration example, in (a support substrate 1 of) each light source element 11B, an electrical connection portion 13 is formed at each of both ends in the same direction (X direction in the figure) as an arrangement direction of a plurality of light source elements 11B for connecting the plurality of light source elements to one another. The light source elements are fixedly held by grooves 92 and outer side faces 91 of respective guide members 90A and 90B therebetween. In the configuration example, when the plurality of light source elements 11B are accommodated between the guide members 90A and 90B, adjacent electrical connection portions 13 contact to each other, thereby the plurality of light source elements 11B are electrically connected to one another. The electrical connection portion 13 of the light source element 11B may have a concavo-convex shape such that adjacent electrical connection portions are engaged with each other in order to secure mechanical connection strength and ease in connection. More specifically, the light source device may be configured in such a manner that an electrical connection portion 13 at one end of the light source element 11B is made to have a male pattern (convex shape), and an electrical connection portion 13 at the other end thereof is made to have a female pattern (concave shape), so that when a plurality of light source elements 11B are arranged, adjacent light source elements are engaged with each other by the respective electrical connection portions 13.

As in the configuration example of FIG. 26, a current path may be formed in each of the guide members 90A and 90B even in the configuration example of FIG. 27. However, since a plurality of light source elements 11B are directly connected to one another by the electrical connection portions 13 of the light source elements 11B in the configuration example of FIG. 27, such a current path may not be necessarily provided. In addition, in the configuration example of FIG. 27, the optional interval D is not provided between the light source elements 11B unlike the configuration example of FIG. 26. Therefore, a non-light-emitting element 14 may be provided for adjusting an interval as needed.

A backlight of a display apparatus may be configured even by using the light source device of the embodiment. Moreover, a partial-driving backlight may be configured by using the device as in the fourth embodiment. For example, when an electrical contact for lead-out to the outside is provided at an optional position in a current path in each of the guide members 90A and 90B so that a light source element 11B at the optional position partially emits light, it is possible to establish the partial-driving backlight.

Other Embodiment

The invention is not limited to the above embodiments, and various other modifications may be made.

For example, while an example of a liquid crystal display apparatus (FIG. 9) is described as a display apparatus in the first embodiment, the light source device of the invention may be used for various display apparatuses other than the liquid crystal display apparatus. Moreover, the light source device of the invention may be used for various applications other than a backlight of a display apparatus.

It should be understood by those skilled in the art that various modifications, combinations, sub-combinations and alterations may occur depending on design requirements and other factors insofar as they are within the scope of the appended claims or the equivalent thereof.

What is claimed is:

1. An apparatus, comprising:
a plurality of light source units configured to produce light, each of the plurality of light source units comprising:
a holding member with a hollow space inside thereof;
a light source element inserted into the hollow space of the holding member, the light source element having an optically transparent substrate, substrate electrodes provided on both ends of the substrate in a longitudinal direction, each substrate electrode including a chip-electrode pad and a terminal electrode pad, one or more optically transparent light emitting elements being disposed on the substrate, each light emitting element including chip electrode pads, each chip electrode pad on the light emitting element being connected to a chip electrode pad on one of the substrate electrodes, each terminal electrode pad being connected with one end of a terminal lead-line,
wherein the plurality of light source units are arranged in cascade in a housing, and wherein a light source element in each of the plurality of light source units is in electric connection with another light source element in an adjacent light source unit in the housing via the terminal lead-line; and
a display section having a first side and a second side, the display section being arranged with respect to the plurality of light source units so that the light produced by the plurality of light source units is incident on the first side,
wherein the display section is configured to alter its transmissivity in response to an image signal so as to selectively allow the incident light to pass to the second side and thereby generate an image corresponding to the image signal.

2. The apparatus according to claim 1, wherein
the holding member has, at each of both ends, a connection electrode electrically connected with the light source element in the hollow space, and
when the plurality of light source units are arranged in cascade, the light source element in the light source unit comes into the electric connection with the another light source element in the adjacent light source unit via the connection electrode of the holding member and a connection electrode of a holding member in the adjacent light source unit.

3. The apparatus according to claim 1, wherein
the holding member is formed of a material which is transparent to visible light.

4. The apparatus according to claim 1, wherein the substrate of the light source element is configured with an optically transparent member, and
the holding member is a cylindrical member having an inner diameter which is substantially the same as a width of the substrate of the light source element, and holds the substrate with an inner circumferential face of the cylindrical member.

5. The apparatus according, to claim 1, wherein
the substrate and the light emitting elements of the light source element include zinc oxide as a main material, and
the light source element emits ultraviolet light.

6. The apparatus according to claim 1, wherein
the holding member is formed of a material which is opaque to ultraviolet light.

7. The apparatus according to claim 2, wherein
each of the both ends of the holding member has a prevention structure which prevents the holding members adjacent to each other from being displaced when the plurality of light source units are arranged in cascade.

8. A device comprising:
a plurality of light source units, each having one or more optically transparent light emitting elements and electrical connection portions, and
a hollow tube structure restricting arrangement of the plurality of light source units so that the plurality of light source units are arranged therein in cascade, wherein
the plurality of light source units are electrically connected to one another via the respective electrical connection portions of the light source units, and wherein each light source unit includes a holding member and light source elements, the light source elements being inserted into a hollow space of the holding member, each light source element having an optically transparent substrate, substrate electrodes being provided on both ends of the substrate in a longitudinal direction, each substrate electrode including a chip electrode pad and a terminal electrode pad and the light emitting elements being disposed on the substrate, each light emitting element including chip electrode pads, each chip electrode pad on the light emitting element being connected to a chip electrode pad on one of the substrate electrodes, each terminal electrode pad connected with one end of a terminal lead-line; and
a display section having a first side and a second side, the display section being arranged with respect to the plurality of light source units so that light produced by the plurality of light source units is incident on the first side, wherein the display section is configured to alter its transmissivity in response to an image signal so as to selectively allow the incident light to pass to the second side and thereby generate an image corresponding to the image signal.

9. The device according to claim 8, further comprising one or more non-light-emitting elements inside the hollow tube to separate the plurality of light source units from one another.

10. The device according to claim 8, wherein each of the light source units includes:
a light source element having the substrate and one or more light emitting elements disposed on the substrate; and
the holding member having, at each of both ends, a connection electrode electrically connected with the light source element in the hollow space, wherein
the light source units adjacent to each other are connected to each other via the connection electrode of the holding member.

11. The device according to claim 10, wherein
the substrate of the light source element is configured with an optically transparent member, and
the holding member is a cylindrical member having an inner diameter which is substantially the same as a width of the substrate of the light source element, and holds the substrate with an inner circumferential face of the cylindrical member.

12. The device according to claim 8, wherein
the hollow tube has an inner surface which is a fluorescent surface to be excited by light from the light source unit to emit fluorescent light, and
the fluorescent light is emitted to the outside.

13. The device according to claim 12, wherein
each of the light source units emits ultraviolet light through an effect of zinc oxide as a main material, and
the hollow tube is opaque to ultraviolet light, and the inner surface of the hollow tube is excited by the ultraviolet light from the light source unit to emit the fluorescent light.

14. The device according to claim 9, wherein
each of the non-light-emitting elements is configured as a non-light-emitting unit which is optically transparent, both ends thereof being electrically conducted to each other, the non-light-emitting unit being arranged in cascade together with the light source units, and
some of the light source units adjacent to each other are electrically connected to each other via the non-light-emitting unit.

15. The device according to claim 14, wherein
outer surface of the non-light-emitting unit is covered with an optically transparent conductive film,
the hollow tube partially has a cut hole, and
the non-light-emitting unit is disposed at a position corresponding to the cut hole to form an electrical contact to outside circuits.

16. The device according to claim 10, wherein
each of the both ends of the holding member has a prevention structure which prevents the holding members adjacent to each other from being displaced.

17. The device according to claim 8, wherein
the hollow tube structure is configured by guide members having grooves, the guide members holding both ends of each of the light source units with the grooves.

18. The device according to claim 17, wherein
each of the plurality of light source units is configured such that the electrical connection portion is formed at each of the both ends in a direction perpendicular to an arrangement direction of the plurality of light source units arranged along the hollow tube structure.

19. The device according to claim 18, wherein
a current path to be connected to the electrical connection portion of each of the light source units is provided in each of the grooves of the guide members, and
the plurality of light source units are electrically connected to one another via the current path.

20. The device according to claim 17, wherein
each of the plurality of light source units is configured such that the electrical connection portion is formed at each of both ends in the same direction as an arrangement direction of the plurality of light source units arranged along the hollow tube structure.

21. The device according to claim 8, further comprising a housing which accommodates a plurality of the hollow tube structures.

22. A display apparatus comprising:
an illumination device configured to produce illumination light; and
a display section having a first side and a second side, the display section being arranged with respect to the illumination device so that the illumination light produced by the illumination device is incident on the first side,
wherein:
the display section is configured to alter its transmissivity in response to an image signal so as to selectively allow the incident illumination light to pass to the second side and thereby generate an image corresponding to the image signal,
the illumination device has a plurality of rod-shaped light sources, each of the rod-shaped light sources having an optically transparent cylindrical tube with a hollow space inside thereof and a plurality of light source units emitting light provided inside the hollow space of each cylindrical tube, and
the light source units are arranged in cascade inside the optically transparent cylindrical tube, and the light source units adjacent to each other are electrically connected to each other, and wherein each light source unit having a holding member and one or more light source elements inserted into a hollow space of the holding member, each light source element having an optically transparent substrate, substrate electrodes provided on both ends of the substrate in a longitudinal direction, each substrate electrode including a chip electrode pad and a terminal electrode pad, one or more optically transparent light emitting elements being disposed on the substrate, each light emitting element including chip electrode pads, each chip electrode pad on the light emitting element being connected to a chip electrode pad on one of the substrate electrodes, each terminal electrode pad being connected with one end of a terminal.

* * * * *